(12) United States Patent
Kawaguchi et al.

(10) Patent No.: US 12,089,427 B2
(45) Date of Patent: Sep. 10, 2024

(54) IMAGING ELEMENT AND ELECTRONIC APPARATUS INCLUDING A STEPPED STRUCTURE

(71) Applicant: SONY SEMICONDUCTOR SOLUTIONS CORPORATION, Kanagawa (JP)

(72) Inventors: Nanako Kawaguchi, Kanagawa (JP); Tetsuji Yamaguchi, Kanagawa (JP); Masashi Nakata, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 760 days.

(21) Appl. No.: 17/250,415

(22) PCT Filed: Jul. 12, 2019

(86) PCT No.: PCT/JP2019/027641
§ 371 (c)(1),
(2) Date: Jan. 19, 2021

(87) PCT Pub. No.: WO2020/022100
PCT Pub. Date: Jan. 30, 2020

(65) Prior Publication Data
US 2021/0288113 A1    Sep. 16, 2021

(30) Foreign Application Priority Data
Jul. 27, 2018 (JP) .................. 2018-140946

(51) Int. Cl.
*H10K 39/32* (2023.01)
*H10K 30/80* (2023.01)

(52) U.S. Cl.
CPC ............. *H10K 39/32* (2023.02); *H10K 30/80* (2023.02)

(58) Field of Classification Search
CPC ........ H10K 30/80; H10K 39/32; H10K 39/33; H10K 39/34
See application file for complete search history.

(56) References Cited

U.S. PATENT DOCUMENTS 4,574,313 A * 3/1986 Battson .................. H04N 25/72
                                                                348/320
6,969,166 B2 * 11/2005 Clark .................... B41M 3/006
                                                                347/101
(Continued)

FOREIGN PATENT DOCUMENTS

JP     2005-085933 A    3/2005
JP     2012-080065 A    4/2012
(Continued)

OTHER PUBLICATIONS

International Search Report and Written Opinion of PCT Application No. PCT/JP2019/027641, issued on Oct. 1, 2019, 10 pages of ISRWO.

*Primary Examiner* — William B Partridge
*Assistant Examiner* — David Paul Sedorook
(74) *Attorney, Agent, or Firm* — CHIP LAW GROUP

(57) ABSTRACT

The present technology relates to an imaging element and an electronic apparatus which make it possible to acquire a variety of information regarding a subject including polarization information. Included are an organic photoelectric conversion film that has a light-transmitting property, is oriented in a predetermined axial direction, and includes a step; an upper electrode arranged on a light incident surface side of the organic photoelectric conversion film; and a lower electrode arranged on a side of the organic photoelectric conversion film facing the upper electrode. Protrusions and recesses are formed on the light incident surface side of the organic photoelectric conversion film. An accumulation layer that accumulates an electric charge converted by the (Continued)

organic photoelectric conversion film is included between the organic photoelectric conversion film and the lower electrode, and the step is formed depending on the presence or absence of the accumulation layer. The present technology can be applied, for example, to an imaging element that detects a polarization component in a predetermined direction.

15 Claims, 22 Drawing Sheets

(56) References Cited

U.S. PATENT DOCUMENTS

| | | | | |
|---|---|---|---|---|
| 2012/0049044 A1* | 3/2012 | Kuboi | ................. | H01L 27/1464 257/E31.124 |
| 2013/0020663 A1 | 1/2013 | Takimoto | | |
| 2014/0179055 A1* | 6/2014 | Suzuki | ................... | H10K 71/00 438/93 |
| 2015/0206925 A1 | 7/2015 | Takahashi et al. | | |
| 2016/0276413 A1* | 9/2016 | Iida | ........................ | H10K 30/88 |
| 2017/0179463 A1* | 6/2017 | Moriwaki | ............... | H01M 4/48 |
| 2018/0204882 A1 | 7/2018 | Segawa et al. | | |
| 2019/0067612 A1* | 2/2019 | Tashiro | ............... | H01L 27/1461 |
| 2019/0280141 A1* | 9/2019 | Takeuchi | ............ | H01L 31/0682 |

FOREIGN PATENT DOCUMENTS

| | | |
|---|---|---|
| JP | 2013-026332 A | 2/2013 |
| JP | 2014-057231 A | 3/2014 |
| JP | 2014-179354 A | 9/2014 |
| JP | 2015-138861 A | 7/2015 |
| JP | 2017-038011 A | 2/2017 |
| JP | 2018-085402 A | 5/2018 |
| WO | 2013/001780 A1 | 1/2013 |
| WO | 2017/026385 A1 | 2/2017 |
| WO | 2018/096980 A2 | 5/2018 |

* cited by examiner

FIG. 9
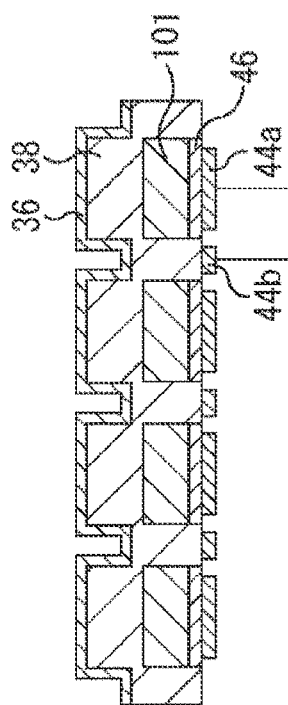
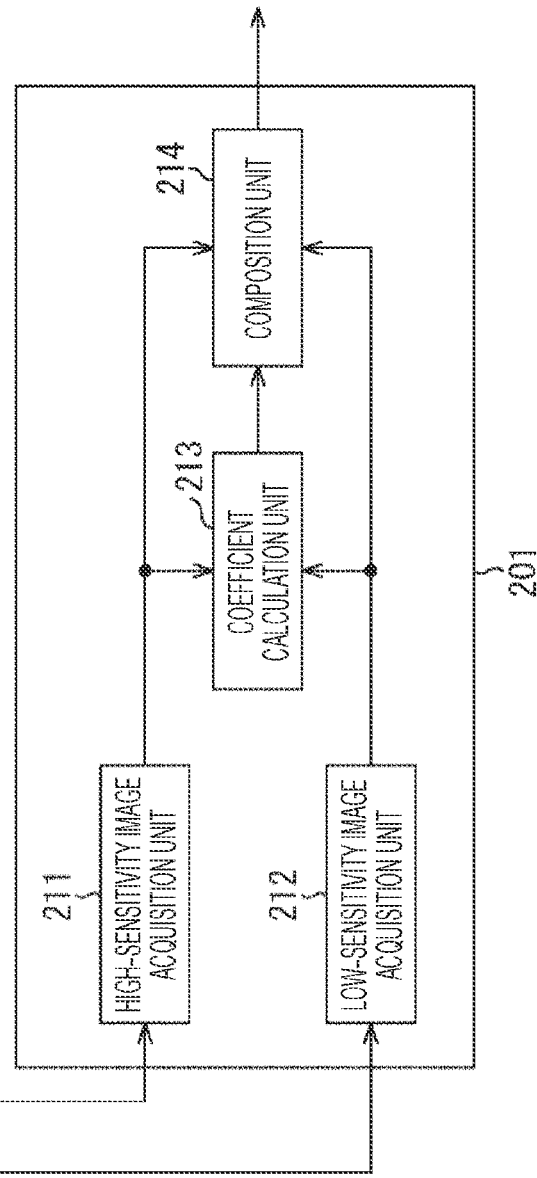

IMAGING ELEMENT AND ELECTRONIC APPARATUS INCLUDING A STEPPED STRUCTURE

CROSS REFERENCE TO RELATED APPLICATIONS

This application is a U.S. National Phase of International Patent Application No. PCT/JP2019/027641 filed on Jul. 12, 2019, which claims priority benefit of Japanese Patent Application No. JP 2018-140946 filed in the Japan Patent Office on Jul. 27, 2018. Each of the above-referenced applications is hereby incorporated herein by reference in its entirety.

TECHNICAL FIELD

The present technology relates to an imaging element and an electronic apparatus, and relates to, for example, an imaging element and an electronic apparatus suitable for use when selectively acquiring an optical component.

BACKGROUND ART

Polarization cameras, which acquire polarization information regarding a subject by a polarization filter mounted on a sensor, have been put into practical use. Use of such a polarization camera makes it possible to acquire information regarding the surface orientation of a subject and the presence of a transparent object, which facilitates object identification and foreign matter detection. Therefore, polarization cameras are expected to be applied to a wide range of fields such as inspection devices on manufacturing lines and on-board cameras (see, for example, Patent Documents 1 and 2).

CITATION LIST

Patent Document

Patent Document 1: Japanese Patent Application Laid-Open No. 2012-80065
Patent Document 2: Japanese Patent Application Laid-Open No. 2014-57231

SUMMARY OF THE INVENTION

Problems to be Solved by the Invention

In principle, polarization cameras detect light which has passed through a polarization filter having a polarization axis in a predetermined direction, i.e., select a light component from light components, and accordingly, information which can be acquired by polarization cameras is limited. On the other hand, information regarding surface orientation and the like which can be acquired by polarization cameras is useful also in various information processes requiring image analysis, so that a technique which can be easily applied to such processes is desired.

The present technology has been made in view of such a situation, and makes it possible to acquire, by imaging, a variety of information regarding a subject including polarization information.

Solutions to Problems

A first imaging element in one aspect of the present technology includes: an organic photoelectric conversion film that has a light-transmitting property, is oriented in a predetermined axial direction, and includes a step; an upper electrode arranged on a light incident surface side of the organic photoelectric conversion film; and a lower electrode arranged on a side of the organic photoelectric conversion film facing the upper electrode.

A first electronic apparatus in one aspect of the present technology includes: an imaging element that includes: an organic photoelectric conversion film that has a light-transmitting property, is oriented in a predetermined axial direction, and includes a step; an upper electrode arranged on a light incident surface side of the organic photoelectric conversion film; and a lower electrode arranged on a side of the organic photoelectric conversion film facing the upper electrode; and a processing unit that processes a signal from the imaging element.

A second imaging element in one aspect of the present technology includes: an organic photoelectric conversion film that has a light-transmitting property, is oriented in a predetermined axial direction, and includes regions having different characteristics; an upper electrode arranged on a light incident surface side of the organic photoelectric conversion film; and a lower electrode arranged on a side of the organic photoelectric conversion film facing the upper electrode.

A second electronic apparatus in one aspect of the present technology includes: an imaging element that includes: an organic photoelectric conversion film that has a light-transmitting property, is oriented in a predetermined axial direction, and includes regions having different characteristics; an upper electrode arranged on a light incident surface side of the organic photoelectric conversion film; and a lower electrode arranged on a side of the organic photoelectric conversion film facing the upper electrode; and a processing unit that processes a signal from the imaging element.

In the first imaging element in one aspect of the present technology, included are: an organic photoelectric conversion film that has a light-transmitting property, is oriented in a predetermined axial direction, and includes a step; an upper electrode arranged on a light incident surface side of the organic photoelectric conversion film; and a lower electrode arranged on a side of the organic photoelectric conversion film facing the upper electrode.

The first electronic apparatus in one aspect of the present technology includes the first imaging element.

In the second imaging element in one aspect of the present technology, included are: an organic photoelectric conversion film that has a light-transmitting property, is oriented in a predetermined axial direction, and includes regions having different characteristics; an upper electrode arranged on a light incident surface side of the organic photoelectric conversion film; and a lower electrode arranged on a side of the organic photoelectric conversion film facing the upper electrode.

The second electronic apparatus in one aspect of the present technology includes the second imaging element.

Note that the electronic apparatus may be an independent device or may be an internal block constituting one device.

Effects of the Invention

According to one aspect of the present technology, a variety of information regarding a subject including polarization information can be acquired by imaging.

Note that the effects described herein are not necessarily limited, and may be any of the effects described in the present disclosure.

BRIEF DESCRIPTION OF DRAWINGS

FIG. 9 is a diagram illustrating an example configuration of an image processing device.

MODE FOR CARRYING OUT THE INVENTION

Hereinafter, modes for carrying out the present technology (hereinafter referred to as embodiments) will be described.

Figure 1:
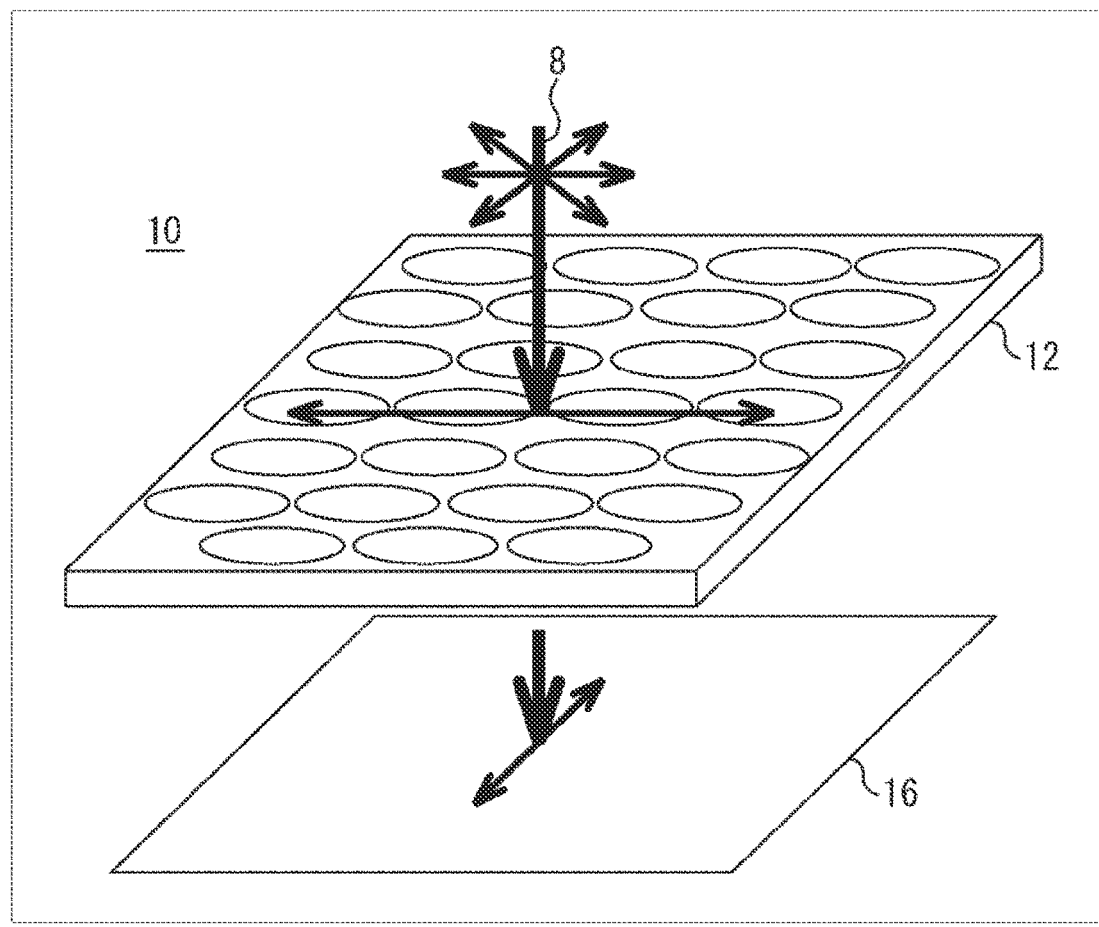
FIG. 1 is a conceptual diagram of an imaging element in the present embodiment.

FIG. 1 is a conceptual diagram of an imaging element in the present embodiment. An imaging element 10 includes a first light detection layer 12 and a second light detection layer 16. The first light detection layer 12 has a structure in which a polarization organic photoelectric conversion film and transparent electrodes formed so as to sandwich the polarization organic photoelectric conversion film are included, a polarization component in a predetermined direction is absorbed to generate an electric charge, and a remaining polarization component is transmitted through the first light detection layer 12. The second light detection layer 16 has a structure of a semiconductor element such as a general charge coupled device (CCD) image sensor or a complementary metal oxide semiconductor (CMOS) image sensor.

The polarization organic photoelectric conversion film of the first light detection layer 12 is obtained by orienting an organic photoelectric conversion material in a predetermined direction, absorbs a polarization component of incident light 8 in a direction parallel to an orientation axis (absorption long axis), and converts the polarization component into an electric charge. A remaining component, that is, a polarization component in a direction perpendicular to the orientation axis, is transmitted and photoelectrically converted in the second light detection layer 16. By reading the electric charges generated in both layers, the polarization components in two directions can be detected at the same position, and the incident light 8 can be reflected in a detection result without waste.

Figure 2A:
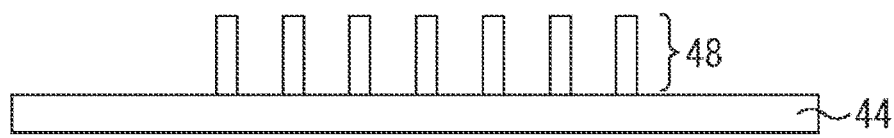
FIGS. 2A, 2B, and 2C are views schematically illustrating an example of a method for forming a polarization organic photoelectric conversion film of a first light detection layer in the present embodiment.
Figure 2B:
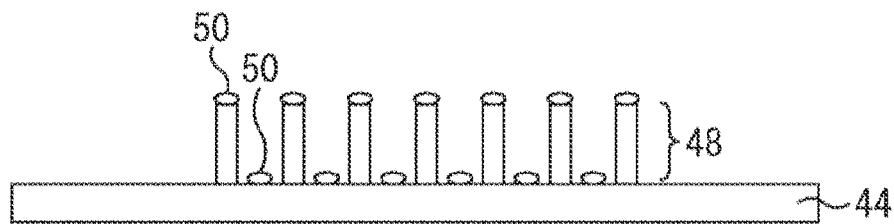
Figure 2C:
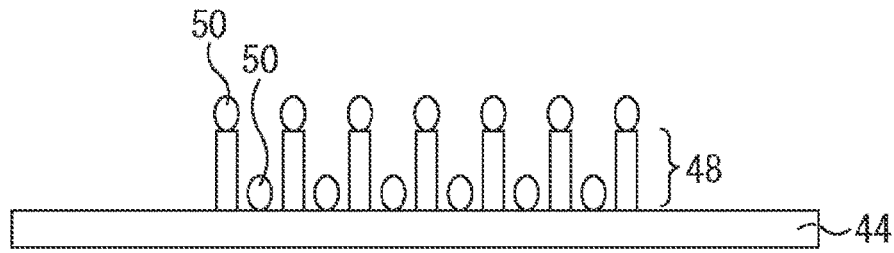

FIGS. 2A, 2B, and 2C schematically illustrate an example of a method for forming a polarization organic photoelectric conversion film of the first light detection layer 12. First, as illustrated in FIG. 2A, an orientation control layer 48 is formed by vacuum oblique evaporation of SiO2 on a lower electrode 44 which is transparent. The orientation control layer 48 is a portion which creates a portion corresponding to a step which will be described later, and in the figure, multiple vertical protrusions (rectangular parallelepipeds) are formed at predetermined intervals.

Next, as illustrated in FIG. 2B, an organic photoelectric conversion film 50 having light absorption anisotropy is evaporated or applied on the orientation control layer 48. Therefore, as illustrated in FIG. 2C, the organic photoelectric conversion film can be formed in a state where the orientation axes are aligned in a predetermined direction. In the figure, the organic photoelectric conversion film 50 on an upper portion of each rectangular parallelepiped and the organic photoelectric conversion film 50 between the rectangular parallelepipeds each gradually grow to thereby form the organic photoelectric conversion film in the state where the orientation axes are aligned in a predetermined direction.

In addition to the above, various techniques for aligning the orientation in a predetermined axial direction, such as formation of an orientation control layer by rubbing, pulling, or fine trenches, and use of a photo-orientation film, have been put into practical use, and any of the techniques may be adopted in the present embodiment.

Figure 3:
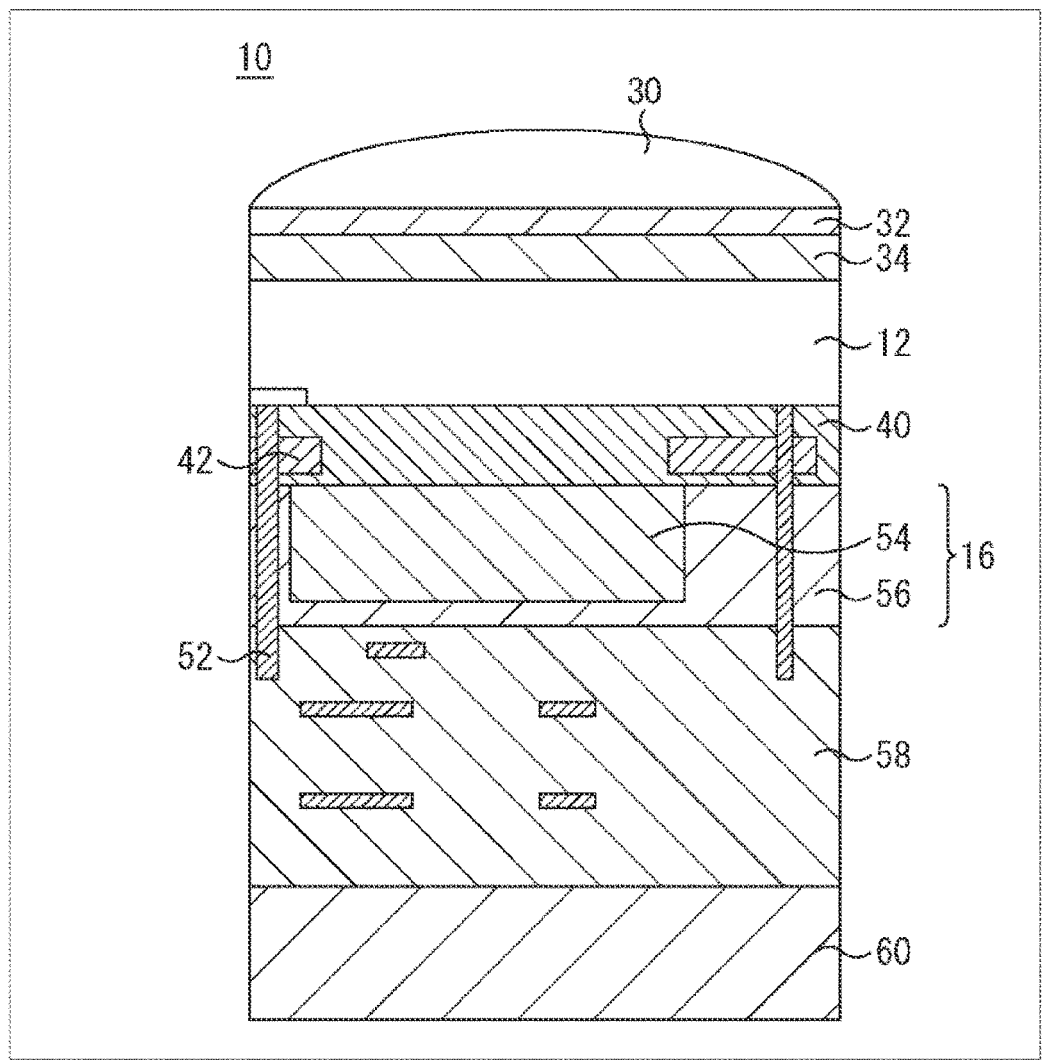
FIG. 3 is a cross-sectional view illustrating an example structure of the imaging element of the present embodiment.

FIG. 3 illustrates, as a cross-sectional view, an example structure of the imaging element of the present embodiment. The imaging element 10 has a structure in which the second light detection layer 16, the first light detection layer 12, and an on-chip lens 30 are stacked in this order on a multi-layered wiring layer 58 for transferring a detection result as an electrical signal, and a support substrate 60 is bonded to a back side of the multi-layered wiring layer 58.

The first light detection layer 12 includes an organic photoelectric conversion film 38 which photoelectrically converts a polarization component in a predetermined direction, and an upper electrode 36 and the lower electrodes 44 for applying a voltage thereto to extract signal electric charges, which will be described in detail later with reference to FIGS. 5 to 7.

The on-chip lens 30 is provided above the first light detection layer 12 via a protective film 34 and a planarization layer 32. The protective film 34 is formed by using an inorganic material having a light-transmitting property, for example, silicon oxide, silicon nitride, silicon oxynitride, or the like. The planarization layer 32 is formed by using a resin having a light-transmitting property, for example, an acrylic resin, a styrene resin, an epoxy resin, or the like. However, the protective film 34 may also serve as the planarization layer 32. The on-chip lens 30 focuses incident light on each pixel region of the first light detection layer 12.

The second light detection layer 16 is provided below the first light detection layer 12 via an interlayer insulating film 40. Here, the interlayer insulating film 40 includes a light-shielding layer 42, and suppresses incident of light from a horizontal direction onto the second light detection layer 16. The second light detection layer 16 has a structure in which a photoelectric conversion element 54 is embedded in a silicon substrate 56 in association with each pixel. Note that in the figure, one lower electrode 44 associated with a pixel of the first light detection layer 12 and one photoelectric conversion element 54 associated with a pixel of the second light detection layer 16 are provided for the organic photoelectric conversion film 38 having a different orientation axis in the first light detection layer 12.

The first light detection layer 12 includes the organic photoelectric conversion film 38 which photoelectrically converts a polarization component in a predetermined direction, which will be described in detail later with reference to FIGS. 5 to 7. In a case where a material having wavelength-dependent sensitivity is used as a material of the organic photoelectric conversion film 38, a color image can be acquired with the structure of the imaging element 10 illustrated in FIG. 3. Furthermore, it is also possible to acquire a color image by providing a color filter on an upper layer of the first light detection layer 12 or the second light detection layer 16.

By arranging such imaging elements 10 as illustrated in a matrix in the horizontal and depth directions of the figure and connecting a peripheral circuit which controls timing of reading electric charges, it is possible to constitute an image sensor which simultaneously acquires pieces of light information regarding at least two types of light as two-dimensional data. Moreover, as described later, the first light detection layer 12 includes steps therein, and obtains different signals between upper and lower portions of the steps. Therefore, the imaging element 10 is configured as an image sensor which simultaneously acquires pieces of light information regarding at least two types of light, or three types of light depending on the configuration, as two-dimensional data.

The configuration of the peripheral circuit for reading electric charges can be similar to that of a general image sensor. However, one or two types of images whose pixel values are each a detection value of the first light detection layer 12 and two or three images whose pixel values are each a detection value of the second light detection layer 16 are read in parallel, so that two or three similar peripheral circuits are provided. Alternatively, a configuration may be employed in which one or two types of images whose pixel values are each a detection value of the first light detection layer 12 and two or three images whose pixel values are each a detection value of the second light detection layer 16 are sequentially read, and thus one peripheral circuit is provided.

Figure 4:
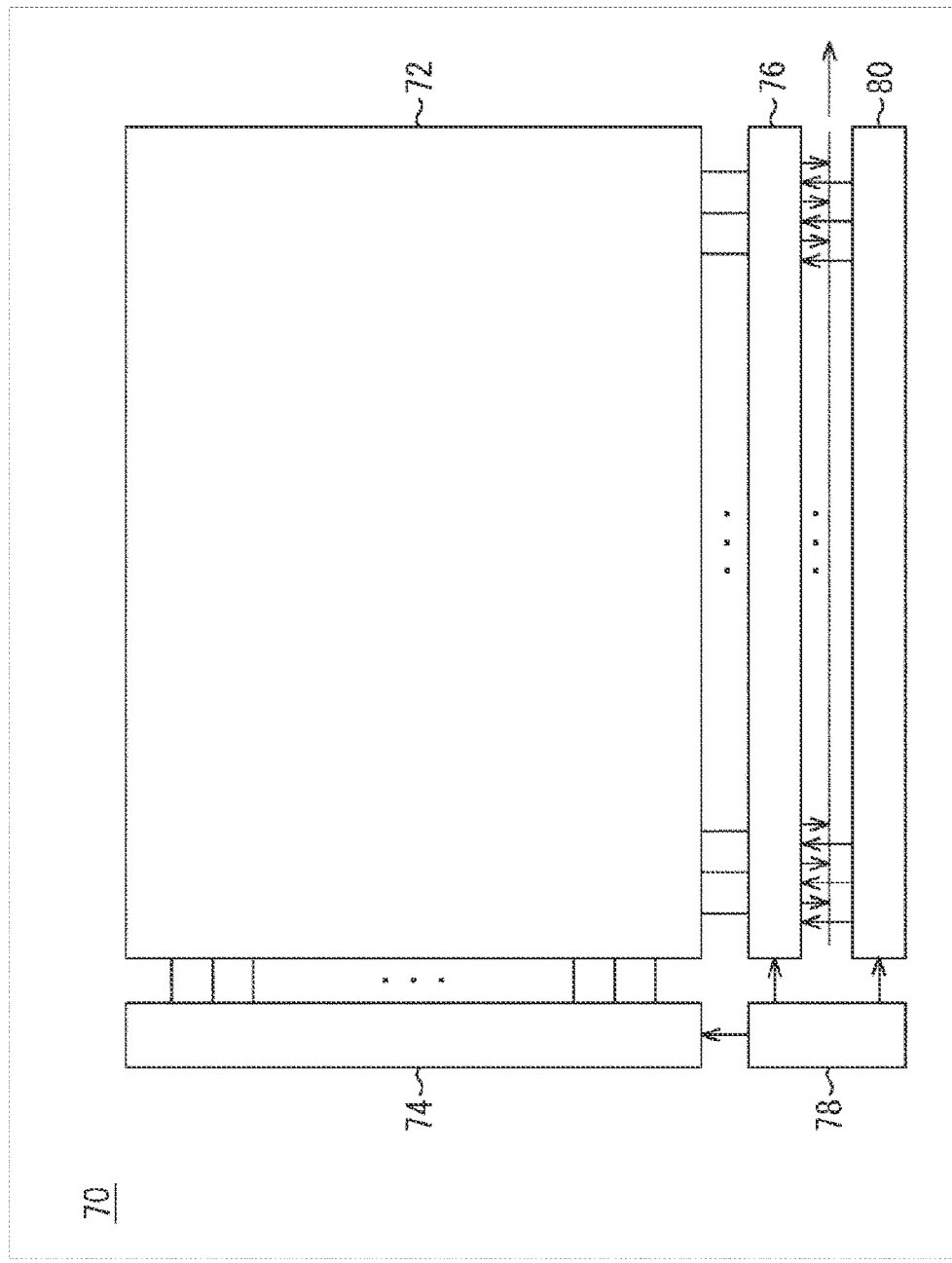
FIG. 4 is a diagram illustrating an overview of a structure of an image sensor in the present embodiment.

FIG. 4 illustrates an overview of a structure of the image sensor in the present embodiment. An image sensor 70 includes a pixel unit 72, and as peripheral circuits, a row scanning unit 74, a horizontal selection unit 76, a column scanning unit 80, and a control unit 78. The pixel unit 72 is obtained by arraying such imaging elements 10 as illustrated in FIG. 3 in a matrix. In the present embodiment, an electric charge which indicates a polarization component parallel to the orientation axis of the organic photoelectric conversion film constituting the first light detection layer 12 and an electric charge which indicates a polarization component orthogonal thereto are respectively read from the first light detection layer 12 and the second light detection layer 16 on a pixel basis.

In the figure, one of the three peripheral circuits for reading is illustrated as a representative. Respective pixels each including an existing mechanism such as a transistor for reading electric charges generated by photoelectric conversion and accumulated in an electric charge accumulation layer are connected to the row scanning unit 74 for each row thereof, and to the horizontal selection unit 76 and the column scanning unit 80 for each column thereof. The row scanning unit 74 includes a shift register, an address code, and the like, and drives respective pixels on a row basis.

Signals output from pixels selectively scanned by the row scanning unit 74 are supplied to the horizontal selection unit 76. The horizontal selection unit 76 includes an amplifier, a horizontal selection switch, and the like. The column scanning unit 80 includes a shift register, an address decoder, and the like, and sequentially drives respective horizontal selection switches of the horizontal selection unit 76, while operating the respective horizontal selection switches. By the selective scanning performed by the column scanning unit 80, signals from respective pixels supplied to the horizontal selection unit 76 are output to the outside. The control unit 78 generates a timing signal, and controls drive timing of the horizontal selection unit 76, the column scanning unit 80, and the like.

Such peripheral circuits as illustrated are each provided for reading signals from the first light detection layer 12 and for reading signals from the second light detection layer 16, and thereby, as an example, output frame rates of a plurality of types of images based thereon can be controlled independently. For example, the frame rate of images from the first light detection layer 12 is made smaller than the frame rate of images from the second light detection layer 16.

Specifically, when the latter is set at 60 fps, the former is set at 30 fps, for example. Consequently, time for accumulation of electric charges generated by the first light detection layer 12 can be made longer than that of electric charges generated by the second light detection layer 16, and the sensitivity of the first light detection layer 12 can be improved. For example, in the present embodiment, the first light detection layer 12 has a large interlayer distance to the multi-layered wiring layer 58 for signal reading, so that an operation speed thereof is strictly limited as compared with that of the second light detection layer 16. Therefore, by independently controlling the frame rates of the images from both, it is possible to realize an aspect in which while securing a sufficient output rate of images from the second light detection layer 16, images from the first light detection layer 12 can be output smoothly.

<Configuration of First Light Detection Layer>

A configuration of the first light detection layer 12 will be described with reference to FIGS. 5 to 7. FIG. 5 is a plan view of the first light detection layer 12, FIG. 6 is a cross-sectional view taken along a line segment A-A' in FIG. 5, and FIG. 7 is a cross-sectional view taken along a line segment B-B' in FIG. 5.

Figure 5:
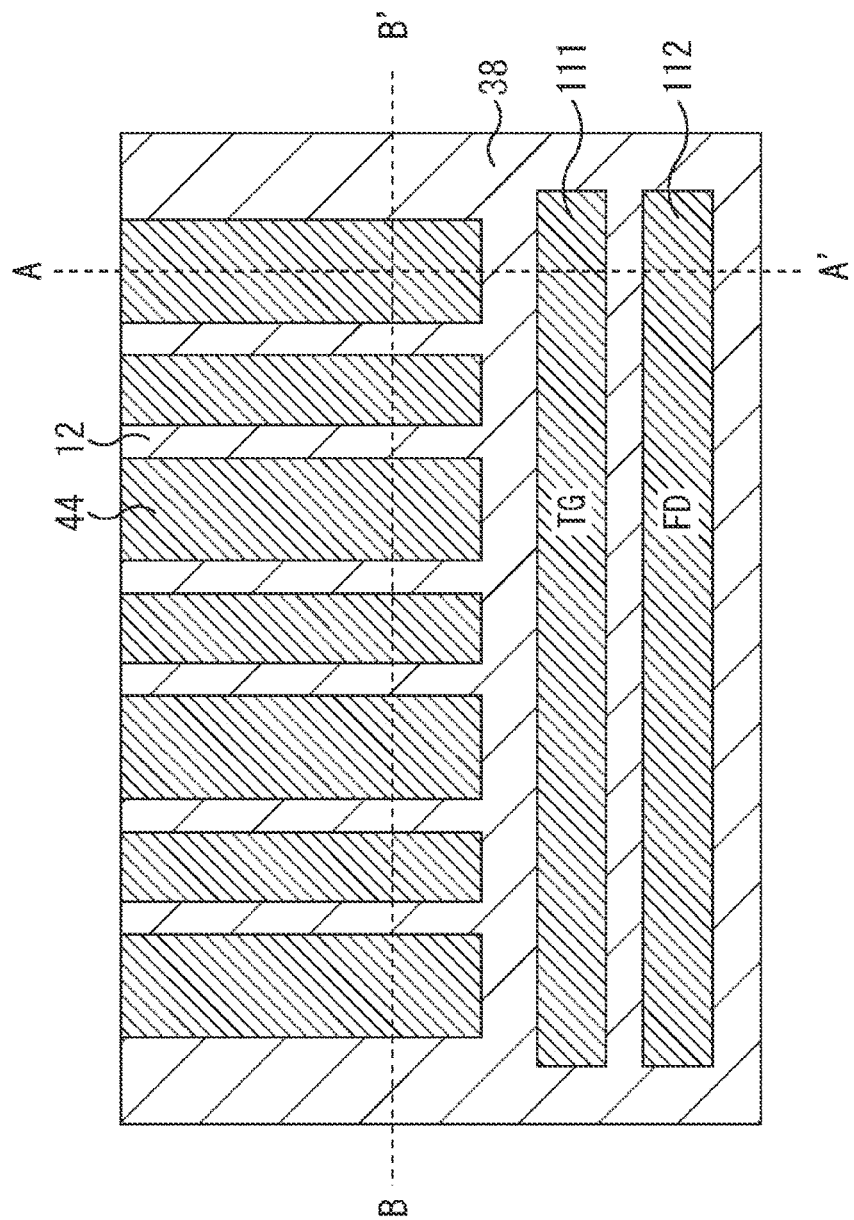
FIG. 5 is a plan view illustrating a configuration of the imaging element.

As in the plan view illustrated in FIG. 5, the lower electrodes 44 are arranged at predetermined intervals on the first light detection layer 12. Furthermore, a TG electrode 111 which forms a part of a transfer transistor and a floating diffusion (FD) electrode 112 which forms a part of an FD are also formed. As illustrated in the cross-sectional view illustrated in FIG. 6, the FD electrode 112 is connected to an FD region 121 formed in the silicon substrate 56.

Figure 6:
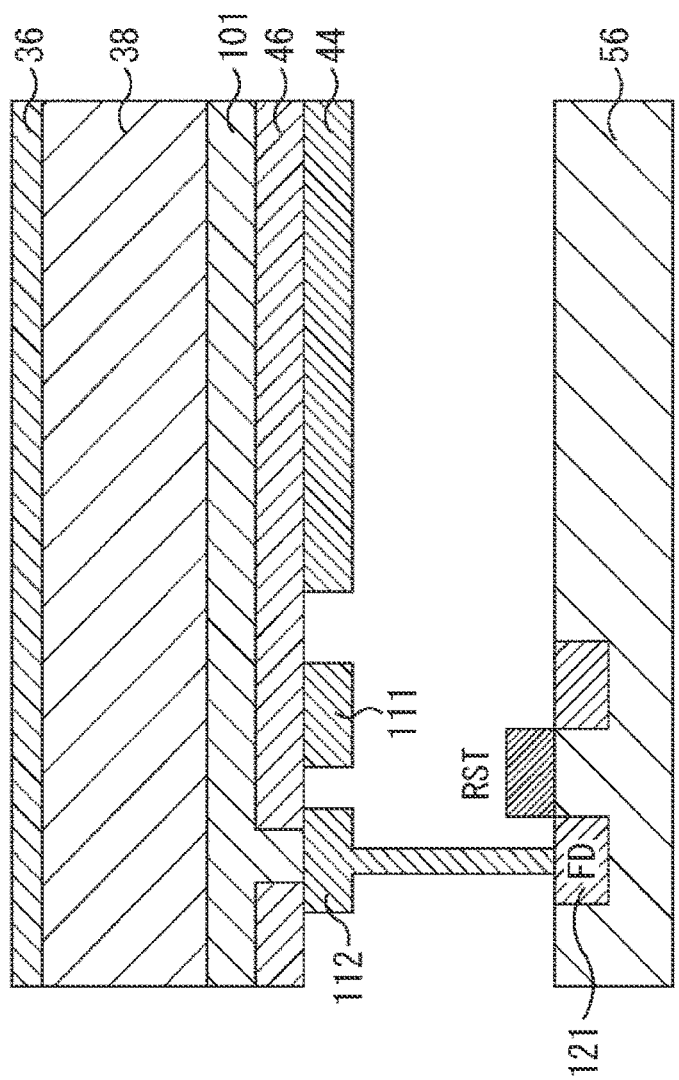
FIG. 6 is a cross-sectional view illustrating the configuration of the imaging element.
Figure 7:
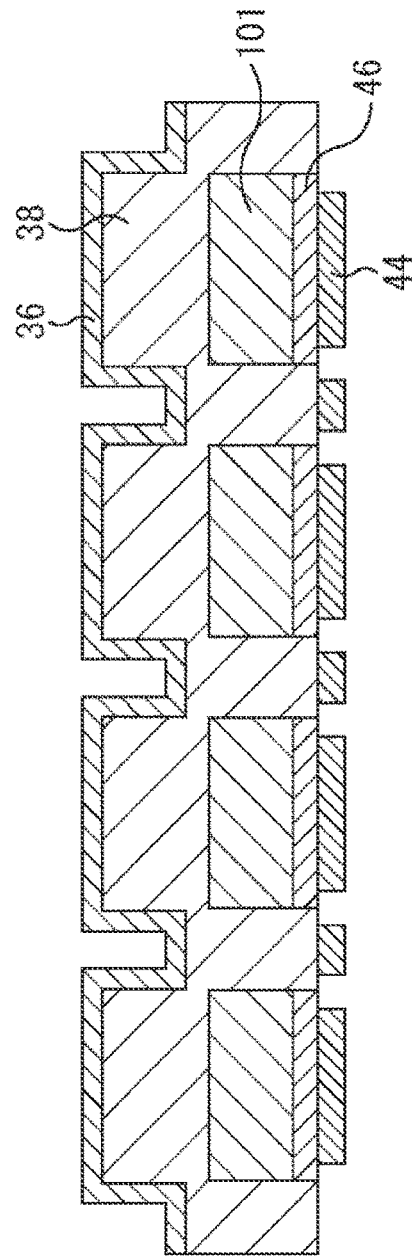
FIG. 7 is a cross-sectional view illustrating the configuration of the imaging element.

With reference to FIGS. 6 and 7, the first light detection layer 12 includes the organic photoelectric conversion film 38 which photoelectrically converts a polarization component in a predetermined direction, and the upper electrode 36 and the lower electrodes 44 for applying a voltage thereto to extract signal electric charges. Furthermore, the first light detection layer 12 includes a transparent semiconductor layer 101 between the organic photoelectric conversion film 38 and an insulating film 46.

The transparent semiconductor layer 101 is constituted with the use of a material having a higher electric charge mobility and a larger band gap than the organic photoelectric conversion film 38. For the transparent semiconductor layer 101, for example, a compound semiconductor material such as IGZO, transition metal dichalcogenide, silicon carbide, diamond, graphene, carbon nanotube, a condensed polycyclic hydrocarbon compound, a condensed heterocyclic compound, and the like are used.

By providing the transparent semiconductor layer 101 including the above materials below a photoelectric conversion layer 22, it is possible to prevent recombination of electric charges upon accumulation thereof from occurring, and to improve transfer efficiency.

In order for the first light detection layer 12 to read electric charges generated by the photoelectric conversion by the organic photoelectric conversion film 38, a conductive plug 52 leading to the multi-layered wiring layer 58 is connected to the lower electrode 44. The electric charges which have moved through the conductive plug 52 are accumulated in an electric charge accumulation layer (not illustrated) and read at a predetermined timing.

The upper electrode 36 is connected to the multi-layered wiring layer 58 by a contact metal layer (not illustrated), and a voltage is applied. The organic photoelectric conversion film 38 absorbs polarization components in multiple directions different from each other in regions (for example, for every pixels) and performs photoelectric conversion, while transmitting the remaining polarization components.

As illustrated in FIG. 3, the imaging element 10 includes the first light detection layer 12 and the second light detection layer 16, which makes it possible to absorb and photoelectrically convert the polarization component in a predetermined direction by the first light detection layer 12, and to absorb and photoelectrically convert the remaining polarization component by the second light detection layer 16, as described above. Therefore, the light received by the imaging element 10 can be used without loss.

It is also possible to employ a configuration of the imaging element 10 in which only the first light detection layer 12 is included and the second light detection layer 16 is not included. In such a case, an image sensor can be configured which is capable of receiving light of the polarization component in a predetermined direction by the first light detection layer 12 and obtaining image data in the polarization component in the predetermined direction.

Furthermore, as described later, according to the imaging element 10 including the first light detection layer 12 to which the present technology is applied, polarization components in a predetermined direction can be acquired by the first light detection layer 12 with different sensitivities with one pixel, and a wide dynamic range image can be generated by using multiple polarization components.

Furthermore, as described later, according to the imaging element 10 including the first light detection layer 12 to which the present technology is applied, it is also possible to employ a configuration in which polarization components in different directions can be acquired by the first light detection layer 12 with one pixel, and light received by the imaging element 10 can be used without loss, similarly to the imaging element 10 including the first light detection layer 12 and the second light detection layer 16 illustrated in FIG. 3.

As described above, according to the imaging element 10 to which the present technology is applied, an imaging element can be obtained which can generate a wide dynamic range image or can use received light without loss even if the configuration thereof includes only the first light detection layer 12 (organic photoelectric conversion film).

In the following description, the first light detection layer 12 will be further described. The first light detection layer 12 described below can be applied to an imaging element including only the first light detection layer 12, and can also be applied to an imaging element including the first light detection layer 12 and the second light detection layer 16.

The organic photoelectric conversion film 38 constituting the first light detection layer 12 is formed by using, for example, a quinacridone derivative, a naphthalene derivative, an anthracene derivative, a conjugate polymer, or the like, being oriented in a predetermined axial direction as described above.

As an organic photoelectric conversion material used for the organic photoelectric conversion film 38, for example, any one of naphthalene, anthracene, phenanthrene, tetracene, pyrene, perylene, or fluoranthene, or a derivative thereof is preferably used.

Alternatively, a polymer such as phenylene vinylene, fluorene, carbazole, indole, pyrene, pyrrole, picoline, thiophene, acetylene, or diacetylene, or derivatives thereof may be used. In addition, a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, an anthraquinone-based dye, a chain compound in which a condensed polycyclic aromatic group such as anthracene and pyrene and an aromatic ring or a heterocyclic compound are condensed, or two nitrogen-containing heterocycles of quinoline, benzothiazole, benzoxazole, and the like, having a squarylium group and a croconic methine group as binding chains, or a cyanine-like dye bonded by a squarylium group and a croconic methine group, and the like, can be preferably used.

Note that the above metal complex dye is preferably, but is not limited to, a dithiol metal complex-based dye, a metal phthalocyanine dye, a metal porphyrin dye, or a ruthenium complex dye.

Note that in a case of acquiring a black-and-white image, a material which absorbs a wider wavelength band, with no limitation to a predetermined color, can be used for the organic photoelectric conversion film 38. Such a material and structure have been put into practical use, especially in the field of photovoltaic power generation and the like. For example, as a material which absorbs light in a wide wavelength band of visible light, a polymer such as polythienylene vinylene (PTV) or polyvinylcarbazole (PVK), a material obtained by mixing the polymer with an organic molecule, or the like can be used.

In a case where it is desired to detect only a wavelength band of a predetermined color and to obtain a color image, it is sufficient to form a color filter layer above (on an on-chip lens 30 side of) the upper electrode 36.

The upper electrode 36 and the lower electrode 44 can include an inorganic conductive film having a light-transmitting property, for example, indium tin oxide (ITO), tin oxide (TO), or the like.

With reference to FIG. 7, the transparent semiconductor layers 101 are formed at predetermined intervals. In each portion where the transparent semiconductor layer 101 is formed, the organic photoelectric conversion film 38 and the upper electrode 36 are formed on the transparent semiconductor layer 101. Furthermore, in each portion where the transparent semiconductor layer 101 is formed, the insulating film 46 is formed on a lower side of the transparent semiconductor layer 101, and the lower electrode 44 is formed on a lower side of the insulating film 46.

In each portion where the transparent semiconductor layer 101 is not formed, that is, each portion between the transparent semiconductor layers 101, the organic photoelectric conversion film 38 is formed, and the upper electrode 36 is formed on an upper side of the organic photoelectric conversion film 38. The lower electrode 44 is formed on a lower side of the organic photoelectric conversion film 38. In each portion where the transparent semiconductor layer 101 is not formed, the organic photoelectric conversion film 38 is connected to the lower electrode 44 without via the insulating film 46.

Figure 8:
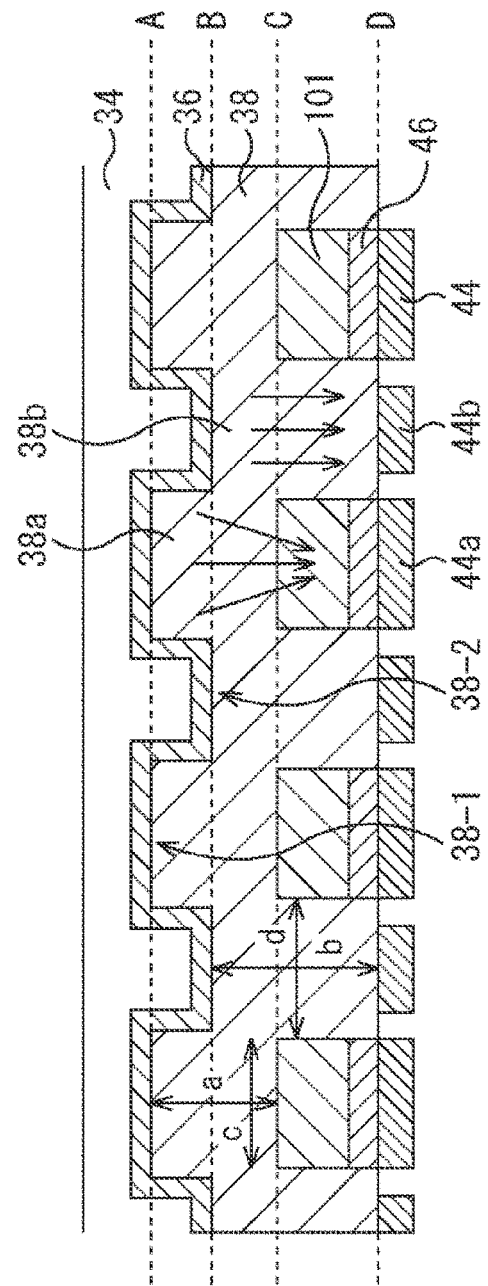
FIG. 8 is a view for explaining a configuration of a transparent semiconductor.

The shape of the organic photoelectric conversion film 38 will be further described with reference to FIG. 8. When viewing an upper portion (on-chip lens 30 side) of the organic photoelectric conversion film 38, fine protrusions and recesses are found to be formed on the organic photoelectric conversion film 38. The recesses and the protrusions vary depending on where a surface to be used as reference (hereinafter described as a reference surface) is set.

A surface located at a boundary between the organic photoelectric conversion film 38 and the upper electrode 36, and close to the protective film 34 is defined as an upper surface 38-1. A surface located at a boundary between the organic photoelectric conversion film 38 and the upper electrode 36, and close to the lower electrode 44 is defined as a lower surface 38-2. It is assumed that a reference surface A is a surface at a position where the upper surface 38-1 is formed, and a reference surface B is a surface at a position where the lower surface 38-2 is formed.

In a case where the reference surface A is used as reference, the shape of the organic photoelectric conversion film 38 includes recesses with respect to the reference surface A. That is, in a case where the reference surface A is used as reference, each lower surface 38-2 is located at a position recessed downward with respect to the reference surface A (=the upper surface 38-1), and the upper portion of the organic photoelectric conversion film 38 is a region where fine recesses are formed. Stated yet another way, it can be said that when the reference surface A is used as reference, the upper portion of the organic photoelectric conversion film 38 is a region where a recess is formed between the upper surface 38-1 and the upper surface 38-1, and thus fine recesses are formed.

In a case where the reference surface B is used as reference, the shape of the upper portion of the organic photoelectric conversion film 38 includes protrusions with respect to the reference surface B. That is, in a case where the reference surface B is used as reference, each upper surface 38-1 is located at a position protruding upward with respect to the reference surface B (=the lower surface 38-2), and the upper portion of the organic photoelectric conversion film 38 is a region where fine protrusions are formed. Stated yet another way, it can be said that when the reference surface B is used as reference, the upper portion of the organic photoelectric conversion film 38 is a region where a protrusion is formed between the lower surface 38-2 and the lower surface 38-2, and thus fine protrusions are formed.

As described above, the organic photoelectric conversion film 38 is formed in a shape having protrusions and recesses. The protrusions and recesses correspond to portions where the transparent semiconductor layer 101 is formed and portions where the transparent semiconductor layer 101 is not formed. The portions where the transparent semiconductor layer 101 is formed each become a protrusion, and the portions where the transparent semiconductor layer 101 is not formed each become a recess. In the following description, the organic photoelectric conversion film 38 at the portion where the transparent semiconductor layer 101 is formed will be described as a protrusion 38a, and the organic photoelectric conversion film 38 at the portion where the transparent semiconductor layer 101 is not formed will be described as a recess 38b.

A surface located at a boundary between the organic photoelectric conversion film 38 and the transparent semiconductor layer 101 is defined as a surface C, and a surface located at a boundary between the organic photoelectric conversion film 38 and the lower electrode 44 is defined as a surface D. Furthermore, the height of the protrusions 38a, in other words, a distance between the reference surface A and the surface C is defined as a height a. Furthermore, the height of the recesses 38b, in other words, a distance between the reference surface B and the surface D is defined as a height b. Furthermore, the width of the protrusions 38a, in other words, the width of the transparent semiconductor layer 101 is defined as a width c. Moreover, the width of the recesses 38b, in other words, an interval between the transparent semiconductor layers 101 is defined as a width d.

It is assumed that the protrusions 38a are each a region surrounded by the height a and the width c. Furthermore, it is assumed that the recesses 38b are each a region surrounded by the height b and the width d. Note that as illustrated in FIG. 6, the protrusions 38a and the recesses 38b have the same length in a depth direction, and in a case where the length is defined as a length e, the volume of the protrusions 38a is height a×width c×length e, and the volume of the recesses 38b is height b×width d×length e.

The lower electrode 44 is formed at each of the protrusions 38a and the recesses 38b. The lower electrode 44 formed at each protrusion 38a is described as a lower electrode 44a, and the lower electrode 44 formed at each recess 38b is described as a lower electrode 44b.

The lower electrode 44a is formed at each protrusion 38a, and the lower electrode 44b is formed at each recess 38b. In other words, the lower electrode 44 includes the lower electrodes 44a which read electric charges generated at upper portions (portions corresponding to the protrusions 38a) of steps generated by the presence or absence of the transparent semiconductor layer 101, and the lower electrodes 44b which read electric charges generated at lower portions (portions corresponding to the recesses 38b) of the steps.

It is configured in such a way that reading of electric charges from the protrusions 38a and reading of electric charges from the recesses 38b can be independently performed by independently controlling the lower electrodes 44a and the lower electrodes 44b.

Light incident on the imaging element 10 is transmitted through the upper electrode 36 and is photoelectrically converted by the organic photoelectric conversion film 38, and carriers are generated in the organic photoelectric conversion film 38. Because an electric field is applied between the upper electrode 36 and the lower electrodes 44, the carriers generated in the organic photoelectric conversion film 38 move to a lower electrode 44 side.

The carriers generated at the protrusions 38a of the organic photoelectric conversion film 38 move to a transparent semiconductor layer 101 side, and are accumulated in the transparent semiconductor layer 101. The transparent semiconductor layer 101 has a function of accumulating and transferring carriers, and includes a material such as those described above. The carriers accumulated in the transparent semiconductor layer 101 are transferred to the FD by the transfer transistor being turned on.

The carriers generated at the recesses 38b of the organic photoelectric conversion film 38 are transferred to the FD by the transfer transistor being turned on.

As described above, the carriers generated at the protrusions 38a of the organic photoelectric conversion film 38 are read from the lower electrodes 44a, and the carriers generated at the recesses 38b of the organic photoelectric conversion film 38 are read by the lower electrodes 44b. That is, the carriers generated at the protrusions 38a of the organic photoelectric conversion film 38 and the carriers generated at the recesses 38b of the organic photoelectric conversion film 38 are read by the electrodes of different systems.

In the description with reference to FIG. 4, it has been described that the imaging element 10 having such configuration as illustrated in FIG. 3 includes three systems of peripheral circuits illustrated in FIG. 4. Two of these systems are a peripheral circuit which includes the lower electrodes 44a that read carriers generated at the protrusions 38a of the organic photoelectric conversion film 38 of the organic photoelectric conversion film 38, and a peripheral circuit which includes the lower electrodes 44b that read carriers generated at the recesses 38b of the organic photoelectric conversion film 38.

In the case of the imaging element 10 having a configuration which does not include the second light detection layer 16 and only includes the first light detection layer 12, two systems of peripheral circuits are included.

The protrusions 38a and the recesses 38b will be further described with reference to FIG. 8.

The height a of the protrusions 38a and the height b of the recesses 38b satisfy any of the relations of height a>height b, height a=height b, and height a<height b. Furthermore, the width c of the protrusions 38a and the width d of the recesses 38b satisfy any of the relations of width c>width d, width c=width d, and width c<width d.

By adjusting the height a, the height b, the width c, and the width d, the sensitivities of the protrusions 38a and the recesses 38b can be adjusted. With reference to FIG. 8, a light incident surface of each protrusion 38a is the reference surface A, and a light incident surface of each recess 38b is the reference surface B. In the imaging element 10, the light incident surface of each recess 38b is located at a position deeper than the light incident surface of each protrusion 38a, and therefore, in a case of focusing only on a depth relation, the sensitivity of the recesses 38b is lower than that of the protrusions 38a.

By adjusting the height a of the protrusions 38a and the height b of the recesses 38b, the sensitivities of the protrusions 38a and the recesses 38b can be adjusted. For example, by adjusting a difference between the height a of the protrusions 38a and the height b of the recesses 38b, a difference in sensitivity between the protrusions 38a and the recesses 38b can be adjusted.

In a case where those other than the height a of the protrusions 38a and the height b of the recesses 38b are set to be the same, and the relation height a>height b or height a=height b is set, the sensitivity of the protrusions 38a is higher than that of the recesses 38b. In a case where the relation height a<height b is set, the sensitivity of the protrusions 38a and that of the recesses 38b are equivalent to each other, or the sensitivity of the protrusions 38a is lower than that of the recesses 38b.

In a case of focusing the width c of the protrusions 38a and the width d of the recesses 38b, wider width provides higher sensitivity. Since the light receiving area becomes wider as the width becomes wider, the wider the width, the higher the sensitivity. In a case where those other than the width c of the protrusions 38a and the width d of the recesses 38b are set to be the same, and the relation width c>width d or width c=width d is set, the sensitivity of the protrusions 38a is higher than that of the recesses 38b. In a case where the relation width c<width d is set, the sensitivity of the protrusions 38a and that of the recesses 38b are equivalent to each other, or the sensitivity of the protrusions 38a is lower than that of the recesses 38b.

By adjusting the height a and the width c of the protrusions 38a and the height b and the width d of the recesses 38b as described above, the sensitivities of the protrusions 38a and the recesses 38b can be adjusted.

Furthermore, the protrusions 38a each include the transparent semiconductor layer 101, but the recesses 38b do not each include the transparent semiconductor layer 101. The sensitivity may change depending on the presence or absence of the transparent semiconductor layer 101 or the material of the transparent semiconductor layer 101.

The height a, the height b, the width c, the width d, the material of the transparent semiconductor layer 101, and the like can be adjusted so that the difference in sensitivity between the protrusions 38a and the recesses 38b is made to be, for example, ⅛ or 1/16.

As described above, regarding the first light detection layer 12 to which the present technology is applied, regions having different characteristics such as sensitivity can be provided in one pixel.

According to the first light detection layer 12 described with reference to FIGS. 5 to 8, it is possible to acquire two image data having different sensitivities (characteristics) with one pixel.

According to the first light detection layer 12, an image corresponding to long-time exposure and an image corresponding to short-time exposure can be obtained at the same time. There is technology for generating a wide dynamic range image by composing an image of long-time exposure and an image of short-time exposure, and such technology can also be applied to the present technology.

FIG. 9 illustrates a configuration of an example of an image processing device which generates a wide dynamic range image. An image processing device 201 illustrated in FIG. 9 can be applied to electronic apparatuses in general which use an imaging device for an image capturing unit (photoelectric conversion unit), and constitutes a part of such electronic apparatuses. Examples of the electronic apparatuses include an imaging device such as a digital still camera or a video camera, a mobile terminal device having an imaging function such as a mobile phone, and a copier using an imaging device for an image reading unit.

That is, the imaging element 10 to which the present technology is applied can be applied as a part of a device for supplying an image to the image processing device 201, and also as a part of a device which is incorporated in any of the above-described electronic apparatuses and images an image. Note that in some cases, a form of a module mounted on an electronic apparatus, that is, a camera module is employed as an imaging device.

The image processing device 201 illustrated in FIG. 9, the image processing device 201, includes a high-sensitivity image acquisition unit 211, a low-sensitivity image acquisition unit 212, a coefficient calculation unit 213, and a composition unit 214.

The high-sensitivity image acquisition unit 211 acquires data from the lower electrodes 44a which read carriers generated at the protrusions 38a, and generates an image. The low-sensitivity image acquisition unit 212 acquires data from the lower electrodes 44b which read carriers generated at the recesses 38b, and generates an image.

Here, the description will be continued while using a case where the sensitivity of the protrusions 38a is higher than that of the recesses 38b as an example. Since the sensitivity of the protrusions 38a is higher than that of the recesses 38b, an image generated by reading the carriers generated at the protrusions 38a is described as a high-sensitivity image. Furthermore, an image generated by reading the carriers generated at the recesses 38b is described as a low-sensitivity image.

The high sensitivity and the low sensitivity here indicate whether or not sensitivity is high as a result of comparison between the sensitivity of one and that of another, and the higher one is described as high sensitivity and the lower one is described as low sensitivity. The high sensitivity and the low sensitivity here are not a description indicating that, when a predetermined standard is set, the sensitivity is higher or lower than the standard.

The high-sensitivity image generated by the high-sensitivity image acquisition unit 211 is supplied to the coefficient calculation unit 213 and the composition unit 214. The low-sensitivity image generated by the low-sensitivity image acquisition unit 212 is supplied to the coefficient calculation unit 213 and the composition unit 214. The coefficient calculation unit 213 calculates a coefficient which indicates a suitable ratio of the high-sensitivity image and the low-sensitivity image to be blended. The coefficient is set so that, for example, in a high-luminance region, a high degree of weighting is set for a pixel value of the low-sensitivity image, and in a low-luminance region, a high degree of weighting is set for a pixel value of the high-sensitivity image. Such a coefficient setting process makes it possible to express pixel values from the low-luminance region to the high-luminance region with higher accuracy.

The composition unit 214 composes the high-sensitivity image and the low-sensitivity image depending on the coefficient calculated by the coefficient calculation unit 213 to generate a composed image. Through these processes, a wide dynamic range image which expresses the pixel values from the low-luminance region to the high-luminance region with higher accuracy is generated and output.

According to the present technology, it is possible to obtain pixel values of different sensitivities (characteristics), that is, a pixel value of high-sensitivity and a pixel value of low-sensitivity, with one pixel.

For example, in a case where a high-sensitivity image and a low-sensitivity image are acquired by conventional long-time exposure and short-time exposure, respectively, a configuration is employed in which pixels for long-time exposure and pixels short-time exposure are arranged alternately, for example, in the pixel unit 72 (FIG. 4), and an image of long-time exposure and an image of short-time exposure are acquired.

In a case where pixels for long-time exposure and pixels for short-time exposure are spatially arranged as described above, it is necessary to perform a process of interpolating pixel values in each of a high-sensitivity image and a low-sensitivity image when composing the images.

According to the present technology, it is possible to obtain a pixel value of high-sensitivity and a pixel value of low-sensitivity with one pixel. Consequently, there is no need to perform such a process of interpolating pixel values, which makes it possible to achieve a reduced processing load, shortened processing time, a simplified circuit configuration, and the like.

Furthermore, according to the present technology, both a high-sensitivity image and a low-sensitivity image can be imaged with the same exposure time.

In a case where a high-sensitivity image and a low-sensitivity image are respectively acquired by long-time exposure and short-time exposure as conventionally done, a video image of a moving subject may possibly be distorted due to a difference in accumulation time, and consequently, it is necessary to perform a process for preventing the video image of the moving subject from being distorted.

According to the present technology, a high-sensitivity image and a low-sensitivity image can be imaged with the same exposure time. Consequently, there is no need to perform such a process to reduce distortion of a video image of a moving subject due to a difference in accumulation time, which makes it possible to achieve a reduced processing load, shortened processing time, a simplified circuit configuration, and the like.

On the other hand, in the present embodiment, it is also possible to change the exposure time. As described above, the first light detection layer 12 includes two systems of peripheral circuits, in other words, a configuration is employed in which reading from the protrusions 38a of the organic photoelectric conversion film 38 and reading from the recesses 38b thereof can be each independently performed, and therefore, reading with different exposure times can be controlled, as well.

In a case where the reading with different exposure times is controlled, the sensitivity can be adjusted with higher accuracy.

As a configuration of the imaging element 10, it is also possible to apply a configuration in which carriers read from the protrusions 38a of the organic photoelectric conversion film 38 and carriers read from the recesses 38b thereof are added in the FD, for example, when imaging a dark place.

<Presence or Absence of Transfer Transistor>

Figure 10:
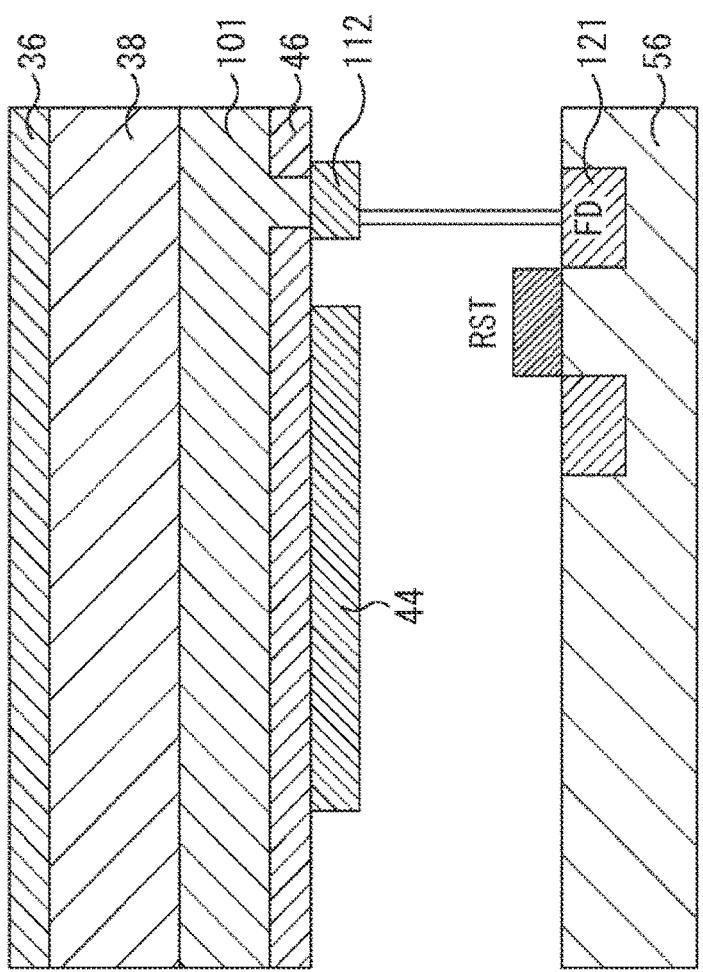
FIG. 10 is a cross-sectional view of the imaging element illustrating an example configuration without a transfer transistor.

As a configuration for transferring the carriers to the FD, a configuration may be employed in which the transfer transistor (TG electrode 111) is provided to perform transfer as illustrated in FIG. 6, or in which transfer is performed without providing the transfer transistor as illustrated in FIG. 10.

As in the first light detection layer 12 illustrated in FIG. 10, a portion where the insulating film 46 is not formed is provided, and the FD electrode 112 is formed at the portion. Due to an electric field applied between the upper electrode 36 and the lower electrode 44, the carriers generated in the organic photoelectric conversion film 38 move to the lower electrode 44 side and are guided to the portion where the insulating film 46 is not formed. Then, the carriers flow from the portion where the insulating film 46 is not formed to the FD electrode 112. Thus, the carriers are read.

Moreover, the efficiency of transfer to the FD electrode 112 can be improved by providing the TG electrode 111 as illustrated in FIG. 6. The TG electrode 111 is formed between the lower electrode 44 and the FD electrode 112, and a predetermined voltage is applied.

The imaging element 10 may include the transfer transistor as illustrated in FIG. 6, or may include no transfer transistor as illustrated in FIG. 10. Either case fall within the scope of application of the present technology.

<Regarding Improvement of Orientation Accuracy>

As described above, the organic photoelectric conversion film 38 includes portions where the transparent semiconductor layer 101 is formed and portions where the transparent semiconductor layer 101 is not formed, and thereby the organic photoelectric conversion film 38 includes the protrusions 38a and the recesses 38b.

In other words, the organic photoelectric conversion film 38 includes steps. The steps of the organic photoelectric conversion film 38 are each generated by the presence or absence of the transparent semiconductor layer 101, and the portions where the transparent semiconductor layer 101 is present correspond to the upper portions of the steps, and correspond to the protrusions 38a. Furthermore, portions where the transparent semiconductor layer 101 is not present correspond to the lower portions of the steps, and correspond to the recesses 38b.

Furthermore, slits are provided in the transparent semiconductor layer 101, and the transparent semiconductor layer 101 is not formed in portions which are the slits. Portions which are not slits correspond to the portions where the transparent semiconductor layer 101 is present, and correspond to the protrusions 38a. Furthermore, the portions which are the slits correspond to the portions where the transparent semiconductor layer 101 is not present, and correspond to the recesses 38b.

Figure 11A:
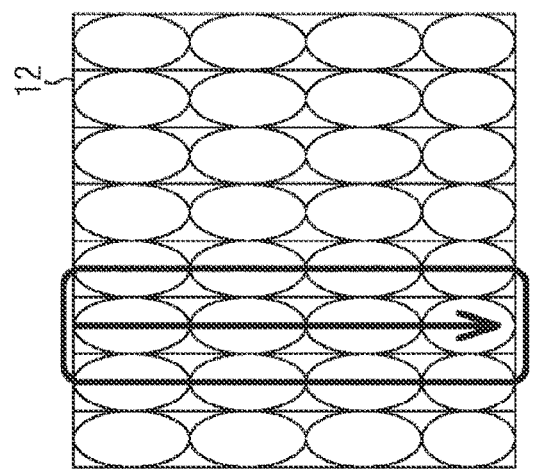
FIGS. 11A and 11B are views for explaining the orientation of crystals.

By providing the steps (slits), as illustrated in FIG. 11A, a crystal growth direction can be oriented in a step (slit) direction. In FIG. 11A, the vertical direction in the figure is the step direction, and the crystal growth direction is oriented in the vertical direction. Furthermore, the crystal growth direction can be made to coincide with a direction in which the lower electrodes 44 are formed, and the coincidence makes it possible to perform reading more efficiently.

Figure 11B:
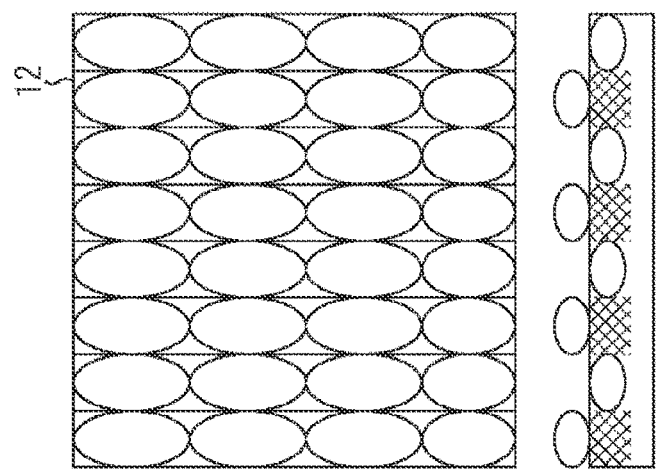

As illustrated in FIG. 11B, light incident on the imaging element 10 is easily absorbed along the crystal growth direction. In FIG. 11B, the vertical direction is the crystal growth direction, and thus light along the crystal growth direction is easily absorbed, but the horizontal direction in the figure is not along the crystal growth direction, and thus light is not easily absorbed. That is, although light in a predetermined direction is absorbed, light in other direction than the predetermined direction is not easily absorbed, and therefore, polarization components can be detected.

Furthermore, the size of crystals can be controlled by providing the steps. For example, as described with reference to FIG. 8, in a case where the width of the protrusions 38a is formed to be the width c and the width of the recesses 38b is formed to be the width d, each of a crystal which matches the size of the width c and a crystal which matches the size of the width d can be grown. The size of crystals to be grown can also be set to a desired size, and from this point as well, it is possible to obtain an imaging element capable of detecting polarization components more accurately.

By forming steps in the organic photoelectric conversion film 38 as described above, the crystal growth direction can be oriented and the size of the crystals can be made uniform, and thus an imaging element capable of detecting polarization components more accurately can be obtained.

<First Light Detection Layer in Second Embodiment>

Figure 12:
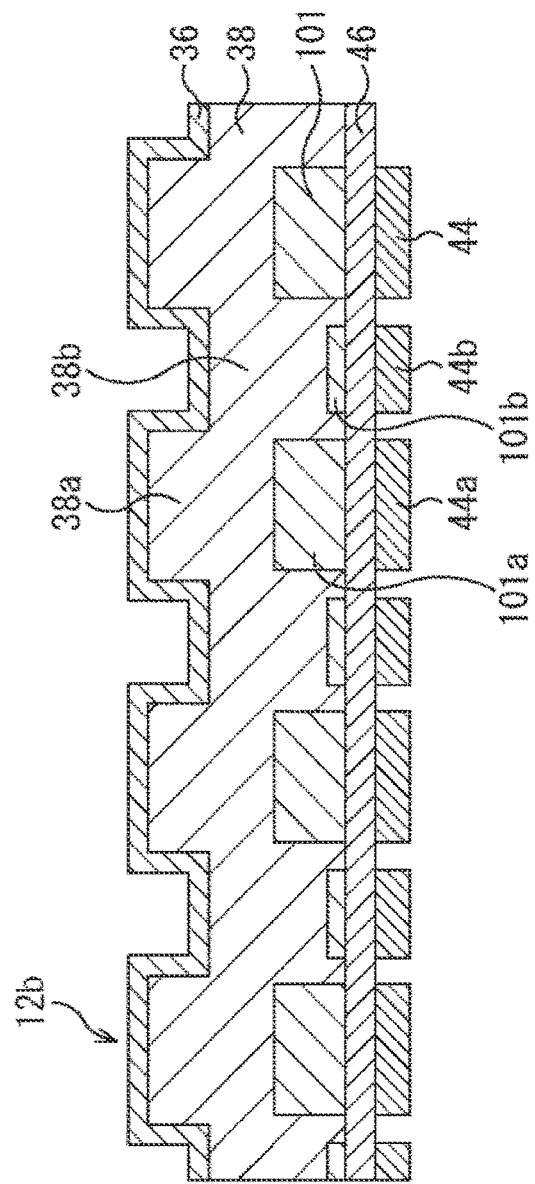
FIG. 12 is a cross-sectional view illustrating an example configuration of a first light detection layer in a second embodiment.

FIG. 12 is a diagram illustrating an example configuration of the first light detection layer 12 in a second embodiment. The description will be continued assuming that the first light detection layer 12 described with reference to FIGS. 5 to 8 is defined as a first light detection layer 12a, and the first light detection layer 12 in the second embodiment is defined as a first light detection layer 12b. Regarding the same components as those of the first light detection layer 12a in the first embodiment, the same reference numerals are given thereto, and the descriptions thereof will be omitted as appropriate.

As compared with the first light detection layer 12a in the first embodiment, the first light detection layer 12b in the second embodiment is different therefrom in a point that the transparent semiconductor layer 101 is formed also at the recesses 38b. With reference to FIG. 12, a transparent semiconductor layer 101b is formed also at the recesses 38b of the organic photoelectric conversion film 38. Here, in order to distinguish the transparent semiconductor layer 101 formed at the protrusions 38a from the transparent semiconductor layer 101 formed at the recesses 38b, the transparent semiconductor layer 101 formed at the protrusions 38a is described as a transparent semiconductor layer 101a, and the transparent semiconductor layer 101 formed at the recesses 38b is described as the transparent semiconductor layer 101b.

The transparent semiconductor layer 101b is formed thinner than the transparent semiconductor layer 101a. Therefore, similarly to the first embodiment, the organic photoelectric conversion film 38 having steps is formed. By forming the transparent semiconductor layer 101b at the recesses 38b as well, also at the recesses 38b, the carriers photoelectrically converted in the recesses 38b are temporarily accumulated in the transparent semiconductor layer 101b, and are read from the lower electrodes 44b at a timing when the transfer transistor is turned on, similarly to the protrusions 38a.

The cross-sectional view of the first light detection layer 12b illustrated in FIG. 12 is a cross-sectional view taken along the line segment B-B' in the plan view of the first light detection layer 12 of FIG. 5. Also in the second embodiment, the cross section taken along the line segment A-A' in the plan view of the first light detection layer 12 of FIG. 5 is the cross-sectional view of the first light detection layer 12 illustrated in FIG. 6, similarly to the first embodiment.

Also in the first light detection layer 12b in the second embodiment, a peripheral circuit which performs reading of carriers from the protrusions 38a and a process thereof, and a peripheral circuit which performs reading of carriers from the recesses 38b and a process thereof are provided in systems different from each other, and are each configured so that a desired process can be performed.

In FIG. 12, the case where the lower electrode 44 is divided into the lower electrodes 44a and the lower electrodes 44b is illustrated, but the lower electrodes 44a and the lower electrodes 44b may be connected to each other (configured as one lower electrode 44).

In the cross section taken along the line segment A-A' (FIG. 5), a configuration is employed in which the reading of the carriers from the protrusions 38a and the reading of the carriers from the recesses 38b can be performed separately, and the transparent semiconductor layer 101a and the transparent semiconductor layer 101b are formed separately. Consequently, in the cross section taken along the line segment B-B' (FIG. 5), that is, the cross section illustrated in FIG. 12, each of the reading of the carriers from the protrusions 38a and the reading of the carriers from the recesses 38b can be controlled even if the lower electrode 44 is integrally configured.

Also in the first light detection layer 12a in the first embodiment, the lower electrodes 44a and the lower electrodes 44b may be integrated in the cross section taken along the line segment B-B' illustrated in FIG. 7.

Note that circuit configurations, shapes and positions of wiring lines, and the like, are merely examples, and the present technology can also be applied to other than those illustrated here.

In the first light detection layer 12b illustrated in FIG. 12, the transparent semiconductor layer 101a and the transparent semiconductor layer 101b may include the same material or may include different materials. The different materials thus included make it possible to change the characteristics of the protrusions 38a and the recesses 38b, and for example, a difference in sensitivity can be more finely adjusted.

Also in the first light detection layer 12b in the second embodiment, a configuration including the transfer transistor can be employed as illustrated in FIG. 6, or a configuration not including the transfer transistor can be employed as illustrated in FIG. 10.

In the first light detection layer 12 in the first embodiment and the second embodiment, the protrusions 38a and the recesses 38b may be each formed at equal intervals, or at unequal intervals. For example, with reference to FIG. 8 again, the respective widths a of multiple protrusions 38a in one pixel may be all the same width or may be different widths.

In the first light detection layer 12 in the first embodiment and the second embodiment, the heights of multiple transparent semiconductor layers 101a in one pixel may be the same as or different from each other. Furthermore, in the first light detection layer 12b in the second embodiment, the heights of multiple transparent semiconductor layers 101b in one pixel may be the same as or different from each other.

The case where the transparent semiconductor layer 101a and the transparent semiconductor layer 101b having different thicknesses are formed in one pixel has been illustrated as the second embodiment, but two or more transparent semiconductor layers 101 having different thicknesses may be formed.

Formation of the multiple transparent semiconductor layers 101 having different thicknesses makes it possible to form multiple steps having different sizes, in other words, multiple regions having different depths from an incident surface. In a case of the above configuration, the imaging element 10 having two or more different sensitivities can be obtained.

Furthermore, the imaging element 10, in which the transparent semiconductor layers 101 having different thicknesses and portions where the transparent semiconductor layer 101 is not formed (portions corresponding to the recesses 38b) are formed, can be obtained in combination with the first embodiment.

<First Light Detection Layer in Third Embodiment>

Figure 13:
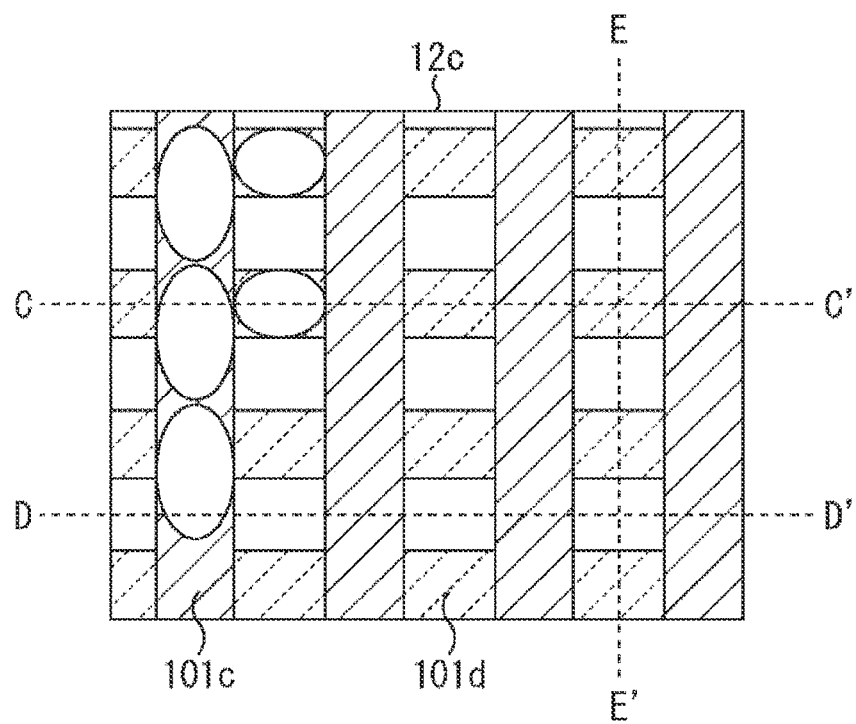
FIG. 13 is a plan view illustrating an example configuration of a first light detection layer in a third embodiment.
Figure 14:
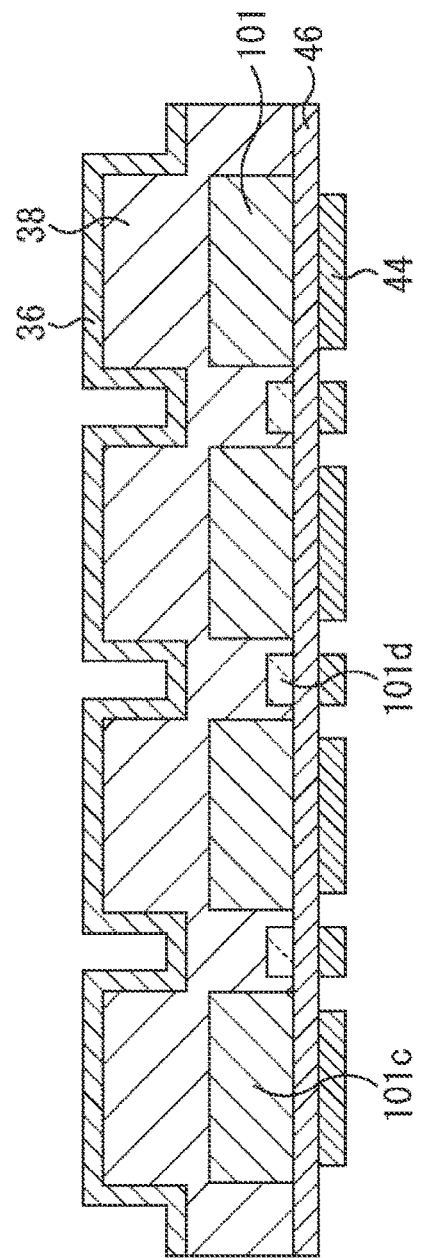
FIG. 14 is a cross-sectional view illustrating the example configuration of the first light detection layer in the third embodiment.

FIG. 13 is a plan view illustrating an example configuration of a first light detection layer 12c in a third embodiment, and FIG. 14 is a cross-sectional view illustrating the example configuration of the first light detection layer 12c in the third embodiment. The description will be continued assuming that the first light detection layer 12 in the third embodiment is defined as the first light detection layer 12c. Regarding the same components as those of the first light detection layer 12a (12b) in the first or second embodiment, the same reference numerals are given thereto, and the descriptions thereof will be omitted as appropriate.

Also in the first light detection layer 12c in the third embodiment illustrated in FIGS. 13 and 14, the transparent semiconductor layers 101 having different thicknesses are formed on the protrusions 38a and the recesses 38b similarly to the first light detection layer 12b in the second embodiment illustrated in FIG. 12, but a difference therefrom resides in that the transparent semiconductor layers 101 having different thicknesses are formed in orthogonal directions.

As illustrated in FIG. 13, in the first light detection layer 12c, multiple transparent semiconductor layers 101c and multiple transparent semiconductor layers 101d are formed so as to be orthogonal to each other on a plane. FIG. 14 is a cross-sectional view illustrating a cross section taken along a line segment C-C' in the first light detection layer 12c illustrated in FIG. 13. As illustrated in FIG. 14, the transparent semiconductor layers 101c are formed thicker than the transparent semiconductor layers 101d.

In FIG. 13, the transparent semiconductor layers 101c are formed in the vertical direction, so that the organic photoelectric conversion film 38 formed at the transparent semiconductor layers 101c includes crystals oriented in the vertical direction. Furthermore, as illustrated in FIG. 13, the transparent semiconductor layers 101c are arranged at predetermined intervals in the first light detection layer 12c when viewed in a line segment D-D' direction. When viewed in cross section, for example, the shape thereof is similar to that of the first light detection layer 12a (FIG. 7), and the portions where the transparent semiconductor layer 101c is formed and the portions where the transparent semiconductor layer 101c is not formed are alternately located.

Similarly to the first light detection layer 12a in the first embodiment, slits (between the transparent semiconductor layer 101c and the transparent semiconductor layer 101c) are provided in the vertical direction, so that crystals in the organic photoelectric conversion film 38 are oriented in the vertical direction. Therefore, light having polarization in the vertical direction is transmitted through the portions where the transparent semiconductor layer 101c is formed.

In FIG. 13, the transparent semiconductor layers 101d are formed in the horizontal direction, so that the organic photoelectric conversion film 38 formed at the transparent semiconductor layers 101d includes crystals oriented in the horizontal direction. Furthermore, as illustrated in FIG. 13, the transparent semiconductor layers 101d are arranged at predetermined intervals in the first light detection layer 12c when viewed in a line segment E-E' direction. When viewed in cross section, for example, the shape thereof is similar to that of the first light detection layer 12a (FIG. 7), and the portions where the transparent semiconductor layer 101d is formed and the portions where the transparent semiconductor layer 101d is not formed are alternately located.

Similarly to the first light detection layer 12a in the first embodiment, slits (between the transparent semiconductor layer 101d and the transparent semiconductor layer 101d)

are provided in the horizontal direction, so that crystals in the organic photoelectric conversion film 38 are oriented in the vertical direction. Therefore, light having polarization in the horizontal direction is transmitted through the portions where the transparent semiconductor layer 101*d* is formed.

As described above, the first light detection layer 12*c* in the third embodiment can have a structure capable of simultaneously detecting the polarization components in each of the vertical direction and the horizontal direction.

Note that here, the description has been given using, as an example, a case of detecting the polarization component in each of the vertical direction and the horizontal direction, in other words, a case where the transparent semiconductor layers 101*c* and the transparent semiconductor layers 101*d* are formed orthogonal to each other, but it is also possible to employ a configuration in which the transparent semiconductor layers 101*c* and the transparent semiconductor layers 101*d* are formed at a predetermined angle (an angle other than orthogonal), and a polarization component in a direction deviated by the predetermined angle is detected.

According to the first light detection layer 12*c* illustrated in FIG. 13, it is possible to provide an imaging element which acquires polarization components in multiple directions with the same pixel at the same time point.

The first light detection layer 12*c* in the third embodiment can be applied to, for example, pixel correction. The suitability of the first light detection layer 12*c* in a case where the first light detection layer 12*c* is applied to pixel correction will be described with reference to FIGS. 15 and 16.

Figure 15:
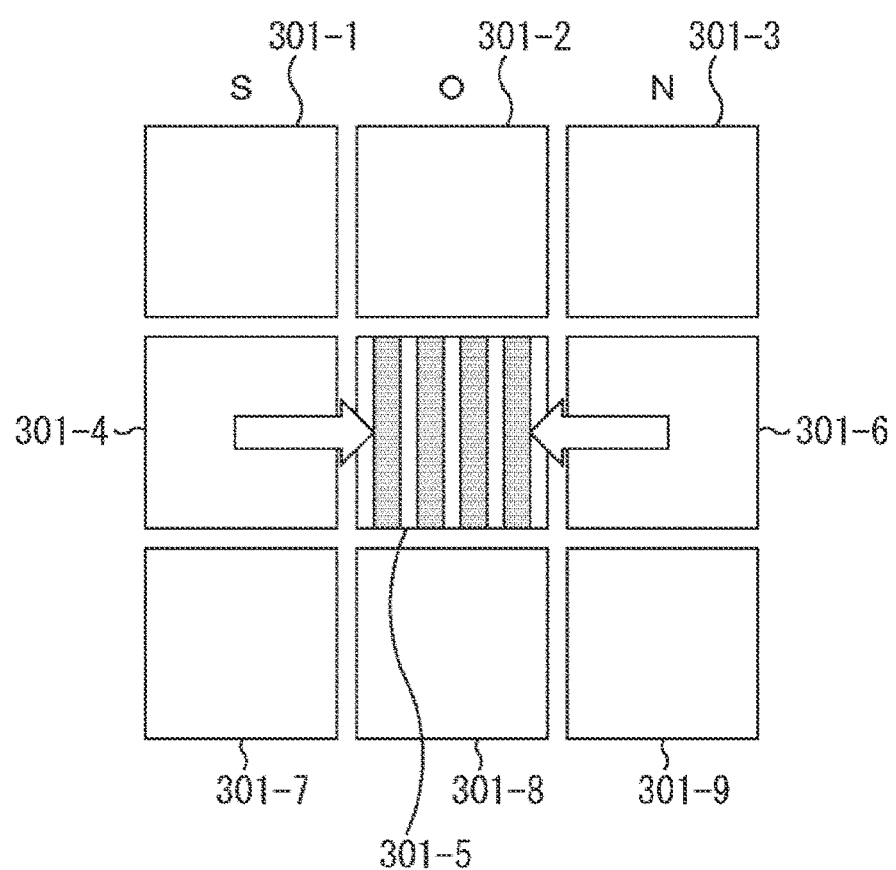
FIG. 15 is a diagram for explaining interpolation of a pixel value.

With reference to FIG. 15, correction in a case where a conventional polarization element is used will be described, and with reference to FIG. 16, correction in a case where a polarization element of the present application (imaging element which includes the first light detection layer 12*c*) is used will be described.

FIG. 15 illustrates a part of pixels arranged in an array in the pixel unit 72 (FIG. 4). FIG. 15 illustrates nine pixels (3×3). Pixels 301-1 to 301-9 are arranged in the pixel unit 72.

Among these, the pixel 301-5 arranged in the center of the figure is assumed to be a conventional imaging element which detects polarization components, or an imaging element which includes the first light detection layer 12*a* in the first embodiment. Furthermore, the pixels 301 other than the pixel 301-5 are assumed to be pixels in which a polarization component is not detected, and to be, for example, an imaging element which includes only the second light detection layer 16.

The pixel 301-5 is different from the pixels 301-1 to 301-9 (excluding the pixel 301-5) in that light of a polarization component is detected in the pixel 301-5. Since the pixel 301-5 has a different characteristic from the other pixels 301, in order to handle the pixel 301-5 as one pixel similarly to the other pixels 301, it is necessary to correct a pixel value obtained from the pixel 301-5 before use.

In a case of correcting the pixel value of the pixel 301-5, the correction cannot be performed by simply multiplying by a predetermined gain because the amount of polarization changes depending on the shape of the subject to be imaged. Therefore, in the case of correcting the pixel value of the pixel 301-5, interpolation is performed such that an average value of a pixel value of the pixel 301-4 on the left side of the pixel 301-5 and a pixel value of the pixel 301-6 on the right side thereof is calculated, and the calculated value is employed as the pixel value of the pixel 301-5.

According to such correction (interpolation), a fine subject image may be distorted in the vertical direction. For example, in a case where there is a vertical line in a column O in FIG. 15, interpolation performed from the pixels 301 located in columns S and N may cause a target pixel in the column O to have a pixel value different from an original pixel value thereof. Furthermore, there is a method in which a line memory is provided and the pixels 301-2 and 301-8 located above and below are also corrected. In the case of the correction, the line memory is required, and the accuracy of the correction does not always improve.

Figure 16:
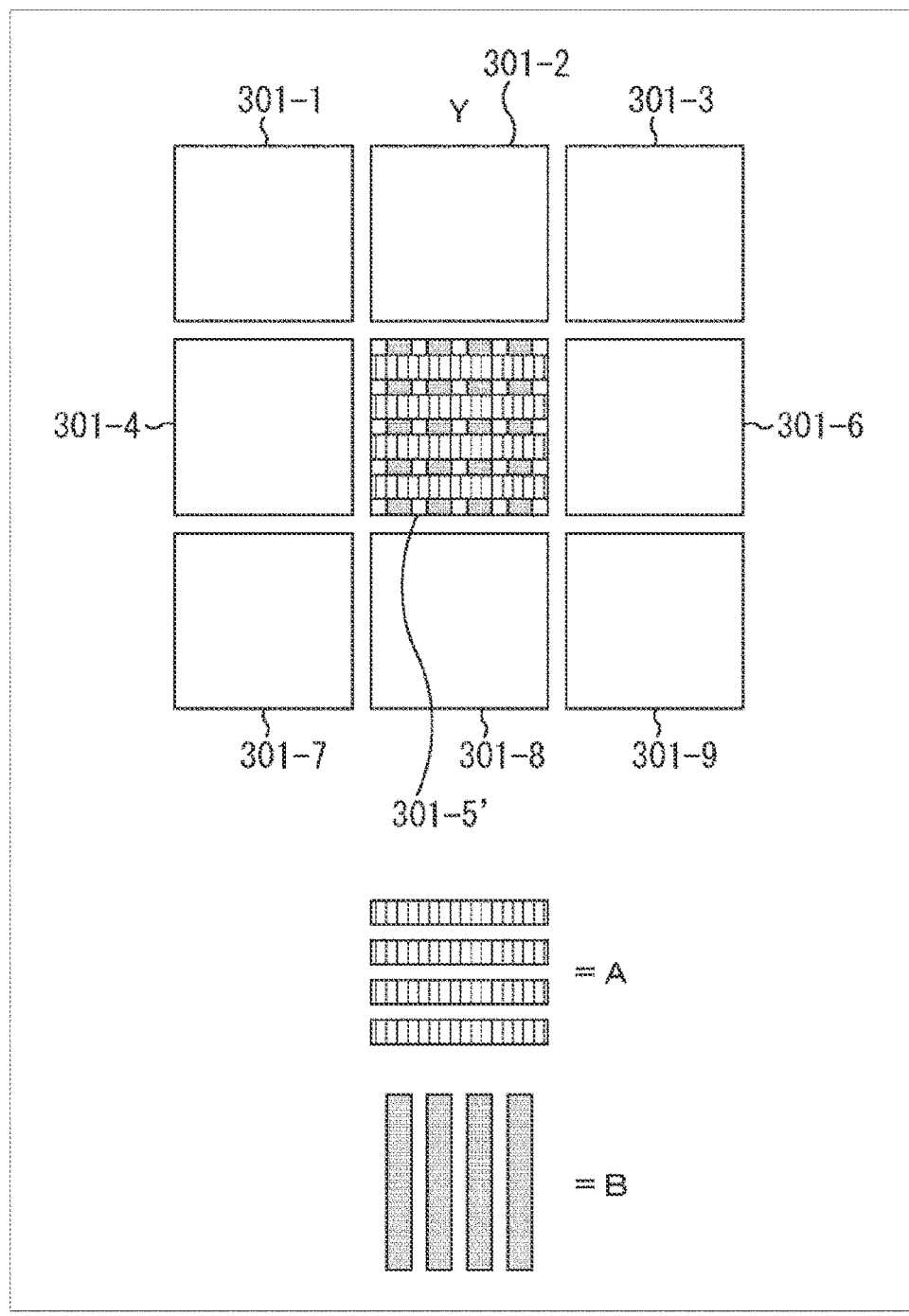
FIG. 16 is a diagram for explaining interpolation of a pixel value.

FIG. 16 illustrates nine pixels (3×3) arranged in an array in the pixel unit 72 (FIG. 4), similarly to FIG. 15. Among the pixels illustrated in FIG. 16, a pixel 301-5' arranged in the center of the figure is assumed to be an imaging element which includes the first light detection layer 12*c* in the third embodiment.

As described above, according to the imaging element which includes the first light detection layer 12*c* in the third embodiment, multiple polarization layers are provided in one pixel, so that it is possible to acquire multiple polarization components. In FIG. 16, among the multiple polarization layers, the horizontal polarization layer in the figure is defined as a polarization layer A (layer including the transparent semiconductor layers 101*d*), and the vertical polarization layer in the figure is defined as a polarization layer B (layer including the transparent semiconductor layers 101*c*).

In a case where the sensitivity of the polarization layer A is lowered than usual due to the shape of the subject (normal vector), the sensitivity of the polarization layer B is increased. That is, the sensitivity of the polarization layer A and the sensitivity of the polarization layer B are in a relation that when one thereof decreases, the other thereof increases. Therefore, if the sensitivity (pixel value) of the polarization layer A and the sensitivity (pixel value) of the polarization layer B are combined, it is possible to estimate sensitivity (pixel value) obtained in a case where the pixel 301-5' has the same configuration as the other pixels 301.

For example, the pixel value of the pixel 301-5' can be calculated by the following formula.

$$\text{Correction value} = 1.5A + 2.5B$$

In this formula, A represents a pixel value obtained from the polarization layer A, and B represents a pixel value obtained from the polarization layer B.

This correction formula is merely an example, and for example, each coefficient is a value appropriately set in accordance with a characteristic of an imaging element. Furthermore, the formula may be a linear formula, or a quadratic or higher-order formula.

Furthermore, in a case of an imaging element called a vertical spectroscopic sensor or the like, the above formula may include coefficients relating to other colors. For example, in a case where a pixel to be corrected is green (G) color (in a case where the first light detection layer 12*c* is set as a layer which receives green light), a coefficient for using red (R) color or blue (B) color may be included in the above formula.

As described above, according to the imaging element which includes the first light detection layer 12*c* in the third embodiment, correction (interpolation) can be performed without using pixel values from other pixels at a time of correction (interpolation), so that it is possible to suppress the occurrence of inconvenience such as that described with reference to FIG. 15. Therefore, according to the imaging element which includes the first light detection layer 12*c*, not only that the polarization component can be extracted, but also that even in a case where a pixel in which a polarization component is not detected is used in combination, a pixel value with accuracy similar to that of other pixels can be calculated.

In the first to third embodiments described above, it has been described that the transparent semiconductor layer 101 is a material having a light-transmitting property. In a case where the second light detection layer 16 is provided below the first light detection layer 12 as in the imaging element 10 illustrated in FIG. 3, the transparent semiconductor layer 101 preferably includes a material having a light-transmitting property so that light reaches the second light detection layer 16.

For example, in a case where the imaging element 10 which includes only the first light detection layer 12 is used and there is no need for the first light detection layer 12 to transmit light, the transparent semiconductor layer 101 may include a material other than a material having a light-transmitting property.

Furthermore, also the lower electrode 44 may include a light-transmitting material or a non-light-transmitting material depending on the configuration of the imaging element 10.

<First Light Detection Layer in Fourth Embodiment>

Figure 17:
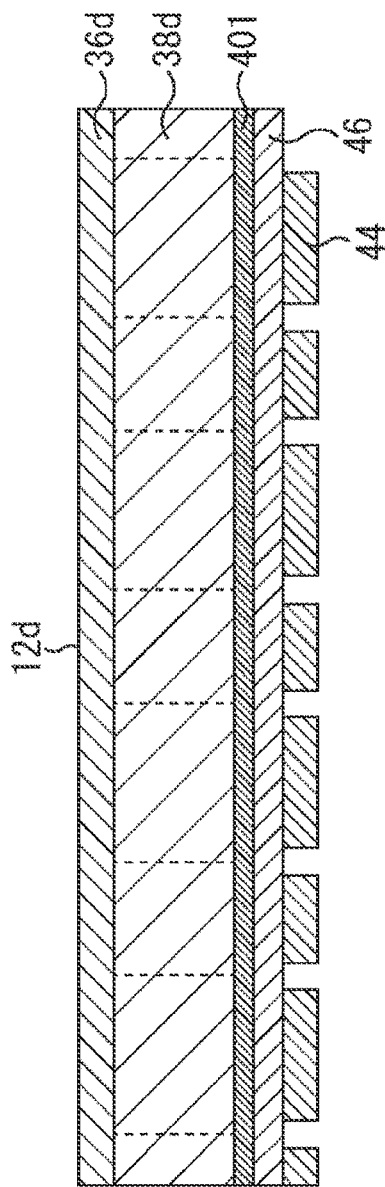
FIG. 17 is a cross-sectional view illustrating an example configuration of a first light detection layer in a fourth embodiment.

FIG. 17 is a cross-sectional view illustrating an example configuration of a first light detection layer 12d in a fourth embodiment. The description will be continued assuming that the first light detection layer 12 in the fourth embodiment is defined as the first light detection layer 12d. Regarding the same components as those of the first light detection layers 12a to c in the first to third embodiments, the same reference numerals are given thereto, and the descriptions thereof will be omitted as appropriate.

With regard to the first light detection layers 12a to c in the first to third embodiments, the descriptions have been given using the example in which the transparent semiconductor layers 101 are formed so as to form steps, thereby orienting the crystals in the organic photoelectric conversion film 38. The first light detection layer 12d will be described which employs a configuration in which a crystal growth direction is controlled by using differences in hydrophilicity and hydrophobicity, as a mechanism for orienting the crystals in the organic photoelectric conversion film 38.

FIG. 17 is a cross-sectional view of the first light detection layer 12d in the fourth embodiment. In the first light detection layer 12d, the insulating film 46 is formed on the lower electrodes 44, and a hydrophilicity control layer 401 is formed on the insulating film 46. An organic photoelectric conversion film 38d is formed on the hydrophilicity control layer 401, and an upper electrode 36d is formed on the organic photoelectric conversion film 38d.

As illustrated in FIG. 17, the organic photoelectric conversion film 38d is formed in a shape with no steps, in other words, is formed not in a shape having protrusions and recesses on an upper portion thereof, but as a flat film. Furthermore, since the organic photoelectric conversion film 38d is formed as a flat film, the upper electrode 36d is also formed as a flat film.

Figure 18:
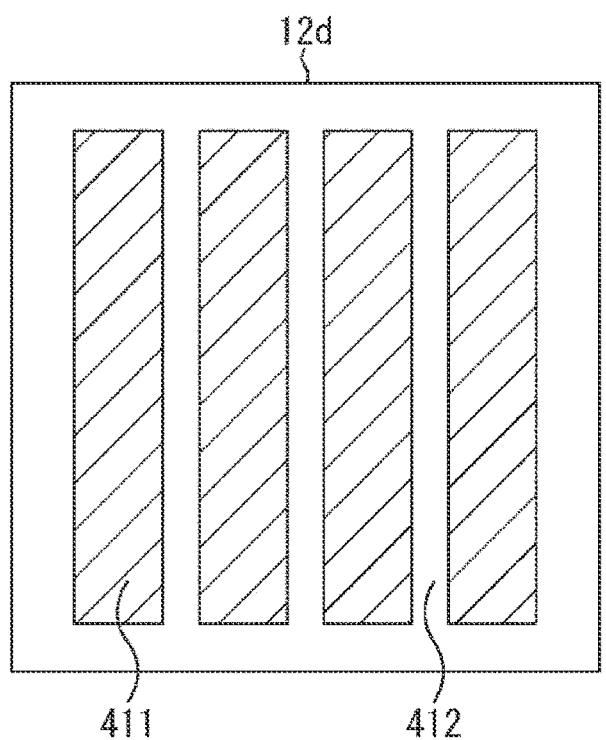
FIG. 18 is a plan view illustrating the example configuration of the first light detection layer in the fourth embodiment.

As illustrated in FIG. 18, when the first light detection layer 12d is viewed from above, a hydrophilic film 411 which is hydrophilic and a hydrophobic film 412 which is hydrophobic are alternately arrayed in the hydrophilicity control layer 401. Here, the terms of hydrophilic film 411 and hydrophobic film 412 are used and the description will be continued assuming that such films are formed, but the hydrophilicity control layer 401 may have any configuration as long as the hydrophilicity of the surface of the hydrophilicity control layer 401 can be controlled, and there is no need for the hydrophilicity control layer 401 to have a physically recognizable thickness.

As control of hydrophilicity, a region corresponding to the hydrophilic film 411 and a region corresponding to the hydrophobic film 412 may be formed, for example, by applying a hydrophobic liquid such as hexamethyldisilazane (HMDS) to the surface. Furthermore, as control of hydrophilicity, a region corresponding to the hydrophilic film 411 may be formed by partially performing ashing.

Furthermore, as control of hydrophilicity, a region corresponding to the hydrophilic film 411 and a region corresponding to the hydrophobic film 412 may be formed by changing a material of the surface of the hydrophilicity control layer 401. For example, the hydrophilicity of the hydrophilicity control layer 401 may be controlled by alternately arranging materials as follows: SiO2 (hydrophobic)/ Si (hydrophilic)/SiO2 (hydrophobic).

A structure for changing the material of the surface of the hydrophilicity control layer 401 can be formed by a normal semiconductor process which includes etching an Si surface partially, forming SiO2 by chemical vapor deposition (CVD), and then performing flattening by chemical mechanical polishing (CMP), and therefore, can be formed without complicating a process for forming the hydrophilicity control layer 401 or increasing the cost.

Providing such a hydrophilicity control layer 401 for controlling hydrophilicity or hydrophobicity makes it possible to control the crystal growth direction in the organic photoelectric conversion film 38d. In a case where the organic photoelectric conversion film 38d is hydrophobic, the crystals spread in a region in a hydrophobic state, and in a case where the organic photoelectric conversion film 38d is hydrophilic, the crystals spread in a region in a hydrophilic state.

The organic photoelectric conversion film 38 formed on hydrophilicity and the organic photoelectric conversion film 38 formed on hydrophobicity are regions having different characteristics. The first light detection layer 12d in the fourth embodiment is a layer in which regions having different characteristics are alternately formed.

Similarly to the first light detection layers 12a to c in the first to third embodiments, the crystal growth direction can be controlled in the first light detection layer 12d in the fourth embodiment, and therefore, regions having different characteristics can be created in one pixel.

The first light detection layer 12d in the fourth embodiment may be configured to detect a polarization component in a predetermined direction with different sensitivities similarly to the first light detection layer 12a or b in the first or second embodiment, and may be applied to a case of generating a wide dynamic range image.

Furthermore, the first light detection layer 12d in the fourth embodiment may be configured to detect polarization components in different directions with one pixel similarly to the first light detection layer 12c in the third embodiment, and may be applied to a case of generating an image using a pixel in which a polarization component is not detected in combination.

The present technology is an imaging element in which the organic photoelectric conversion film 38 is grown with anisotropy and the crystals in the organic photoelectric conversion film 38 are oriented. As the method for growing the organic photoelectric conversion film 38 with anisotropy is not limited to the method for providing steps and the method for controlling hydrophilicity illustrated herein, and other methods can also be applied.

As described above, the present technology can be applied to electronic apparatuses in general which use an imaging device for an image capturing unit (photoelectric conversion unit), and constitutes a part of such electronic apparatuses. Examples of the electronic apparatuses include an imaging device such as a digital still camera or a video camera, a mobile terminal device having an imaging function such as a mobile phone (smartphone), and a copier using an imaging device for an image reading unit.

For example, regarding smartphones, there is an increasing need for accurately capturing an object shape including face recognition and the like, and the present technology can be applied to an imaging device when measuring an object shape.

Furthermore, as electronic apparatuses, for example, there are head-mounted displays (HMD) for virtual reality (VR), augmented reality (AR), mixed reality (MR), and the like, and the present technology can also be applied to these electronic apparatuses.

In such an HMD, a sensor is provided to recognize a gesture. Furthermore, the HMD makes an accurate understanding of a space where a user using the HMD is present, and superimposes a virtual object on a real video image, so that a sensor for making an accurate understanding (imaging a video image) of such a space is also included in the HMD.

The present technology described above can also be applied to such a sensor.

<Example of Application to Endoscopic Surgery System>

Furthermore, for example, the technology according to the present disclosure (the present technology) may be applied to an endoscopic surgery system.

Figure 19:
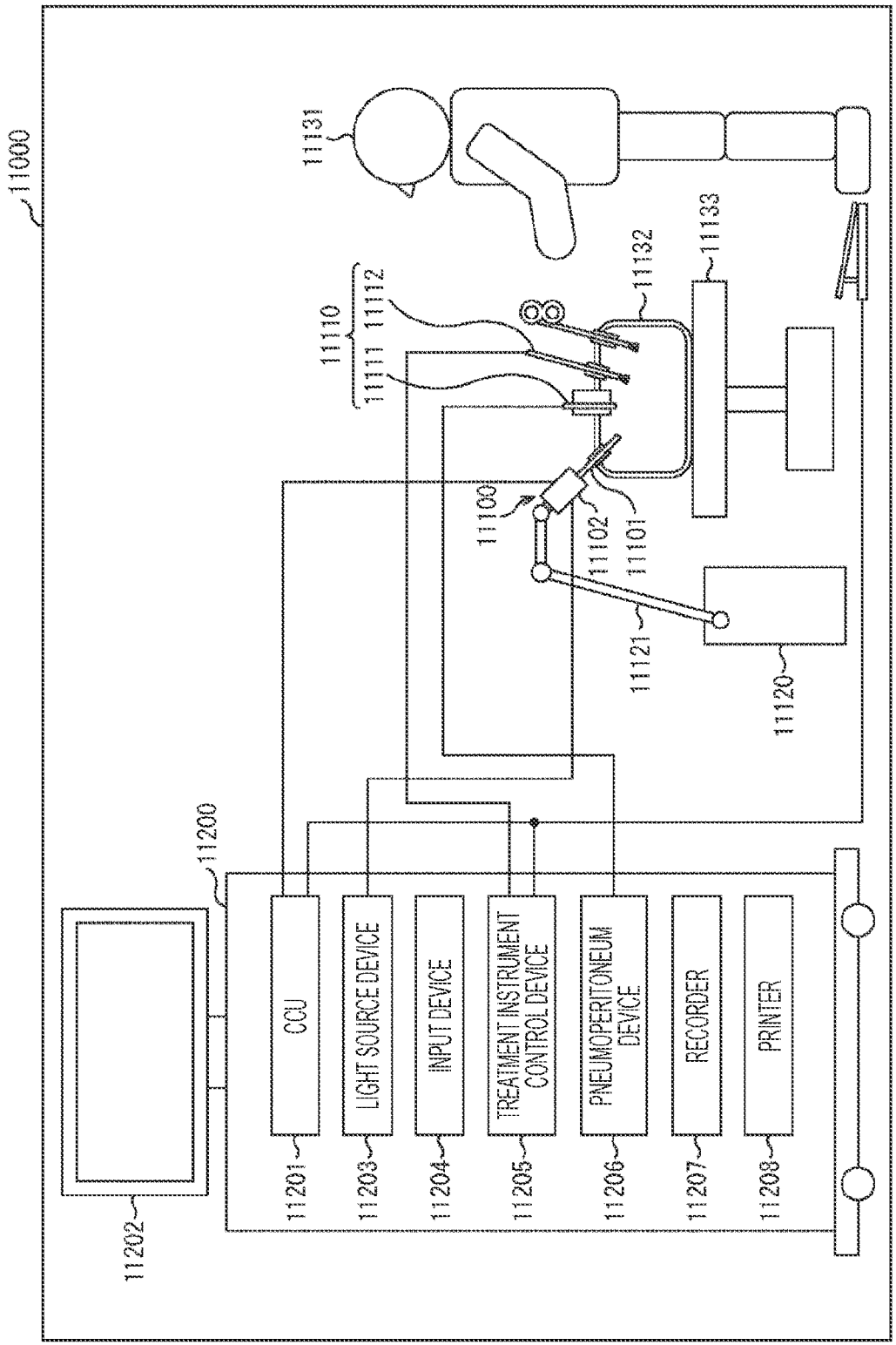
FIG. 19 is a diagram illustrating an example of a schematic configuration of an endoscopic surgery system.

FIG. 19 is a diagram illustrating an example of a schematic configuration of an endoscopic surgery system to which the technology according to the present disclosure (the present technology) can be applied.

FIG. 19 illustrates an operator (doctor) 11131 who are performing surgery on a patient 11132 on a patient bed 11133 using an endoscopic surgery system 11000. As illustrated in the figure, the endoscopic surgery system 11000 includes an endoscope 11100, other surgical instruments 11110 such as a pneumoperitoneum tube 11111 and an energy treatment instrument 11112, a support arm device 11120 which supports the endoscope 11100, and a cart 11200 on which various devices for endoscopic surgery are mounted.

The endoscope 11100 includes a lens barrel 11101 of which a region having a predetermined length from a distal end is inserted into a body cavity of the patient 11132, and a camera head 11102 connected to a proximal end of the lens barrel 11101. In the illustrated example, the endoscope 11100 configured as a so-called rigid endoscope including the lens barrel 11101, which is rigid, is illustrated, but the endoscope 11100 may be configured as a so-called flexible endoscope including a flexible lens barrel.

At the distal end of the lens barrel 11101, an opening in which an objective lens is fitted is provided. A light source device 11203 is connected to the endoscope 11100, and light generated by the light source device 11203 is guided by a light guide extending inside the lens barrel 11101 to the distal end of the lens barrel, and an object to be observed in the body cavity of the patient 11132 is irradiated with the light through the objective lens. Note that the endoscope 11100 may be a forward-viewing endoscope, an oblique-viewing endoscope, or a side-viewing endoscope.

An optical system and an imaging element are provided inside the camera head 11102, and reflected light (observation light) from the object to be observed is collected by the optical system to the imaging element. The observation light is photoelectrically converted by the imaging element, and an electrical signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), and the like, and comprehensively controls operations of the endoscope 11100 and a display device 11202. Moreover, the CCU 11201 receives the image signal from the camera head 11102, and performs various image processes for displaying an image based on the image signal, for example, a development process (demosaic process) and the like, on the image signal.

Under the control of the CCU 11201, the display device 11202 displays an image based on the image signal which has been image-processed by the CCU 11201.

The light source device 11203 includes, for example, a light source such as a light emitting diode (LED), and supplies the endoscope 11100 with irradiation light when a surgical site or the like is imaged.

An input device 11204 is an input interface for the endoscopic surgery system 11000. A user can input various types of information and input instructions to the endoscopic surgery system 11000 via the input device 11204. For example, the user inputs an instruction to change conditions of imaging (type of irradiation light, magnification, focal length, and the like) by the endoscope 11100, and the like.

A treatment instrument control device 11205 controls driving of the energy treatment instrument 11112 for ablation or incision of a tissue, sealing of a blood vessel, or the like. A pneumoperitoneum device 11206 feeds gas into the body cavity of the patient 11132 through the pneumoperitoneum tube 11111 in order to inflate the body cavity for the purpose of securing the field of view of the endoscope 11100 and securing a working space for the operator. A recorder 11207 is a device capable of recording various types of information regarding surgery. A printer 11208 is a device capable of printing various types of information regarding surgery in various forms such as a text, an image, or a graph.

Note that the light source device 11203 which supplies the endoscope 11100 with irradiation light when a surgical site is imaged can include a white light source which includes, for example, an LED, a laser light source, or a combination thereof. In a case where the white light source includes a combination of red, green, and blue (RGB) laser light sources, the output intensity and the output timing of each color (each wavelength) can be controlled with high accuracy, and therefore, the light source device 11203 can adjust the white balance of an image to be imaged. Furthermore, in such a case, by performing irradiation of the object to be observed with laser light from each of the RGB laser light sources in a time-division manner, and controlling driving of the imaging element of the camera head 11102 in synchronization with irradiation timings, images each corresponding to one of R, G, and B colors can be imaged in a time-division manner. According to this method, a color image can be obtained without providing a color filter on the imaging element.

Furthermore, driving of the light source device 11203 may be controlled such that the intensity of light to be output is changed at predetermined time intervals. By controlling the driving of the imaging element of the camera head 11102 in synchronization with the timing of the change in the light intensity to acquire images in a time-division manner and composing the images, a high dynamic range image free from so-called blocked up shadows and blown out highlights can be generated.

Furthermore, the light source device 11203 may be configured to be able to supply light of a predetermined wavelength band adaptive to special light observation. In the special light observation, for example, so-called narrow band imaging is performed in which with the use of the wavelength dependency of absorption of light in body tissues, irradiation with light of a narrow band as compared with irradiation light used for ordinary observation (that is, white light) is performed, and thereby a predetermined tissue such as a blood vessel in a mucosal surface layer is imaged in high contrast. Alternatively, in the special light observation, fluorescence observation may be performed in which an image is obtained by fluorescent light generated by irradiation with excitation light. In the fluorescence observation, for example, it is possible to perform observation of fluorescent light from a body tissue by irradiating the body tissue with excitation light (autofluorescence observation), or to obtain a fluorescence image by locally injecting a reagent such as indocyanine green (ICG) into a body tissue and irradiating the body tissue with excitation light corresponding to a fluorescence wavelength of the reagent. The light source device 11203 can be configured to be able to supply narrowband light and/or excitation light adaptive to such special light observation.

Figure 20:
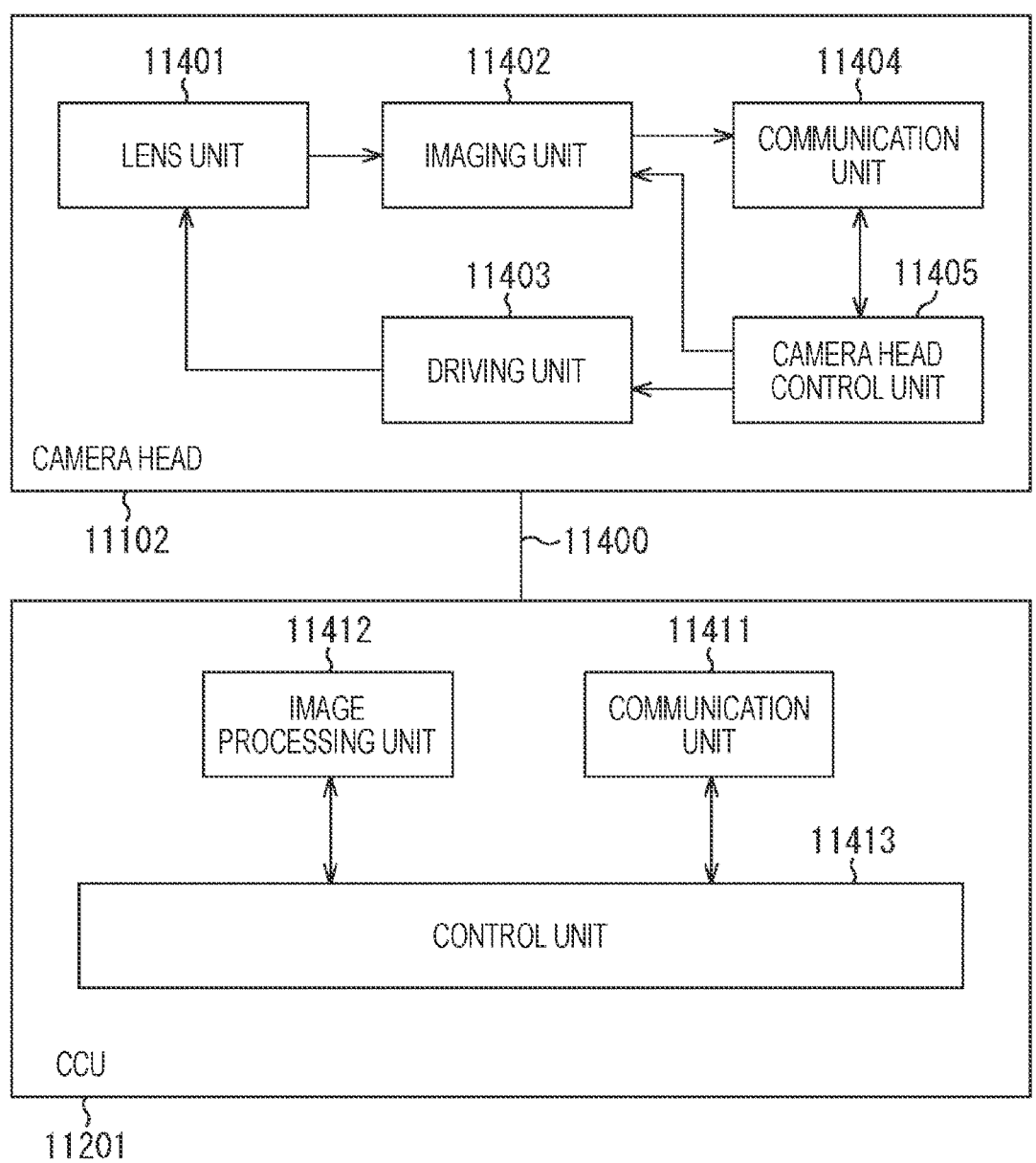
FIG. 20 is a block diagram illustrating an example of a functional configuration of each of a camera head and a CCU.

FIG. 20 is a block diagram illustrating an example of a functional configuration of each of the camera head 11102 and the CCU 11201 illustrated in FIG. 19.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light taken in from the distal end of the lens barrel 11101 is guided to the camera head 11102 and incident on the lens unit 11401. The lens unit 11401 includes a combination of a plurality of lenses including a zoom lens and a focus lens.

The number of imaging elements included in the imaging unit 11402 may be one (so-called single-plate type) or a multiple number (so-called multi-plate type). In a case where the imaging unit 11402 is configured as that of the multi-plate type, a color image may be obtained, for example, by generating image signals each corresponding to one of R, G, and B colors by respective imaging elements, and combining the image signals. Alternatively, the imaging unit 11402 may have a pair of imaging elements, one for acquiring an image signal for the right eye and another for acquiring an image signal for the left eye, the image signals being adaptive to three-dimensional (3D) display. Performing the 3D display enables the operator 11131 to more accurately grasp the depth of a living body tissue in a surgical site. Note that in a case where the imaging unit 11402 is configured as that of the multi-plate type, multiple systems of lens units 11401 can be provided corresponding to respective imaging elements.

Furthermore, the imaging unit 11402 does not necessarily have to be provided in the camera head 11102. For example, the imaging unit 11402 may be provided inside the lens barrel 11101 immediately behind the objective lens.

The driving unit 11403 includes an actuator, and moves the zoom lens and the focus lens of the lens unit 11401 by a predetermined distance along the optical axis under the control of the camera head control unit 11405. Therefore, the magnification and the focus of an image to be imaged by the imaging unit 11402 can be adjusted as appropriate.

The communication unit 11404 includes a communication device for transmitting and receiving various types of information to and from the CCU 11201. The communication unit 11404 transmits an image signal obtained from the imaging unit 11402 as RAW data to the CCU 11201 through the transmission cable 11400.

Furthermore, the communication unit 11404 receives a control signal for controlling the driving of the camera head 11102 from the CCU 11201, and supplies the control signal to the camera head control unit 11405. The control signal includes, for example, information regarding imaging conditions such as information indicating that a frame rate of an image to be imaged is specified, information indicating that an exposure value at a time of imaging is specified, and/or information indicating that the magnification and the focus of the image to be imaged are specified.

Note that the imaging conditions such as the frame rate, the exposure value, the magnification, and the focus described above may be appropriately specified by the user, or may be automatically set by the control unit 11413 of the CCU 11201 on the basis of the acquired image signal. In the latter case, the endoscope 11100 is equipped with so-called auto exposure (AE), auto focus (AF), and auto white balance (AWB) functions.

The camera head control unit 11405 controls the driving of the camera head 11102 on the basis of the control signal from the CCU 11201 received via the communication unit 11404.

The communication unit 11411 includes a communication device for transmitting and receiving various types of information to and from the camera head 11102. The communication unit 11411 receives the image signal transmitted from the camera head 11102 through the transmission cable 11400.

Furthermore, the communication unit 11411 transmits a control signal for controlling the driving of the camera head 11102 to the camera head 11102. The image signal and the control signal can be transmitted by electric communication, optical communication, or the like.

The image processing unit 11412 performs various image processes on the image signal which is the RAW data transmitted from the camera head 11102.

The control unit 11413 performs various types of control regarding imaging of a surgical site or the like by the endoscope 11100 and display of an imaged image obtained by imaging the surgical site or the like. For example, the control unit 11413 generates a control signal for controlling the driving of the camera head 11102.

Furthermore, on the basis of the image signal image-processed by the image processing unit 11412, the control unit 11413 causes the display device 11202 to display an imaged image which includes the surgical site or the like. At that time, the control unit 11413 may recognize various objects in the imaged image by using various image recognition techniques. For example, the control unit 11413 can recognize surgical instruments such as forceps, a particular living body part, bleeding, mist when using the energy treatment instrument 11112, and the like, by detecting edge shapes, colors, and the like of objects included in the imaged image. When the control unit 11413 causes the display device 11202 to display the imaged image, the control unit 11413 may causes the display device 11202 to display a superimposed image including various types of surgery support information superimposed on the image of the surgical site using a result of the recognition. With the superimposed display of the surgery support information and presentation thereof to the operator 11131, a burden on the operator 11131 can be reduced, and the operator 11131 can proceed with the surgery reliably.

The transmission cable 11400 which connects the camera head 11102 and the CCU 11201 is an electrical signal cable adaptive to communication of electrical signals, an optical fiber adaptive to optical communication, or a composite cable including both thereof.

Here, in the illustrated example, the communication is performed by wired communication using the transmission cable 11400, but the communication between the camera head 11102 and the CCU 11201 may be performed by wireless communication.

Note that although the endoscopic surgery system has been described here as an example, the technology according to the present disclosure may be applied to other than that, for example, to a microscopic surgery system or the like.

<Example of Application to Moving Object>

Furthermore, for example, the technology according to the present disclosure may be realized as a device mounted on any type of moving object such as an automobile, an electric vehicle, a hybrid electric vehicle, a motorcycle, a bicycle, a personal mobility, an airplane, a drone, a ship, or a robot.

Figure 21:
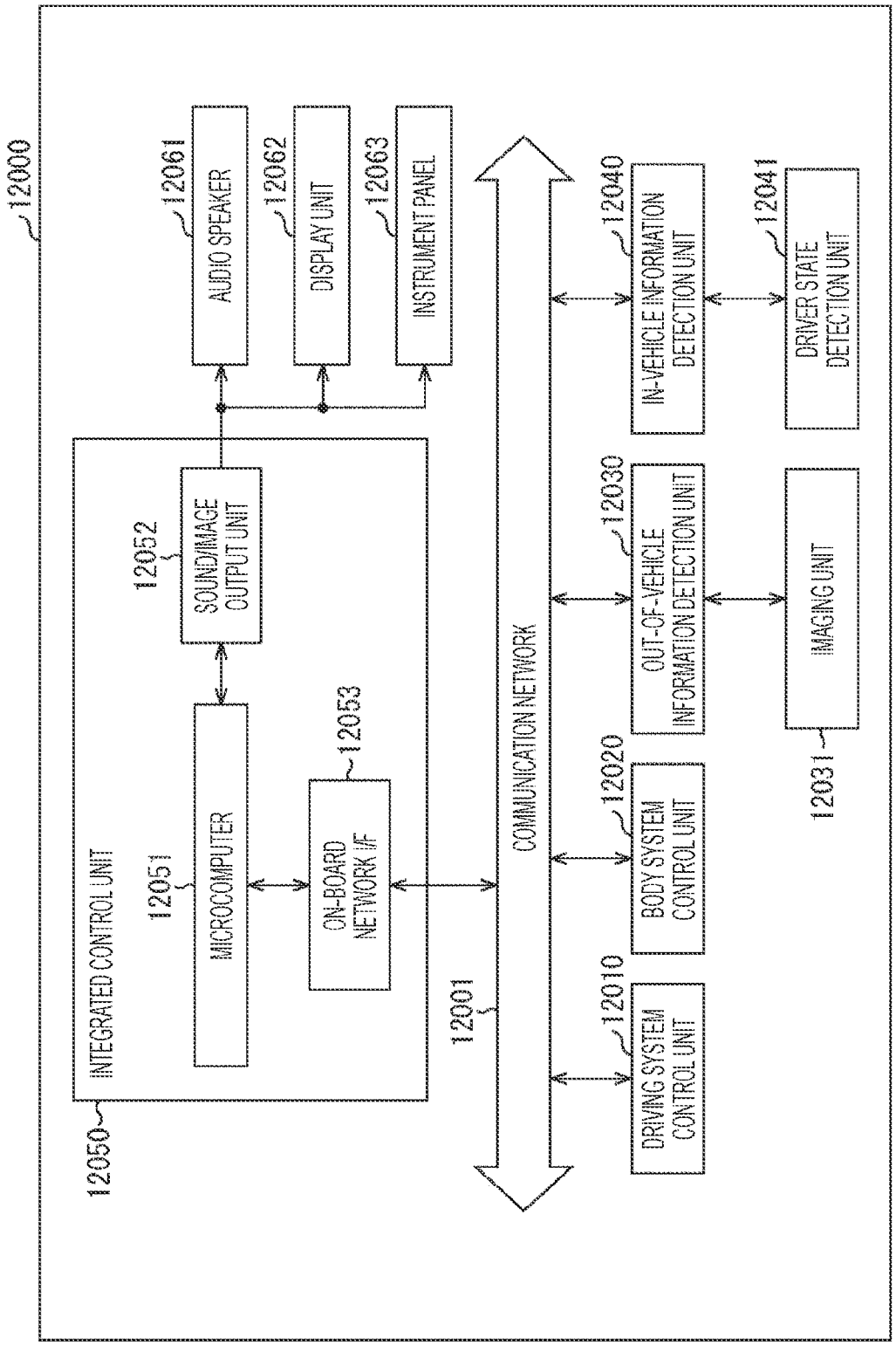
FIG. 21 is a block diagram illustrating an example of a schematic configuration of a vehicle control system.

FIG. 21 is a block diagram illustrating a schematic example configuration of a vehicle control system which is an example of a moving object control system to which the technology according to the present disclosure can be applied.

A vehicle control system 12000 includes a plurality of electronic control units connected via a communication network 12001. In the example illustrated in FIG. 21, the vehicle control system 12000 includes a driving system control unit 12010, a body system control unit 12020, an out-of-vehicle information detection unit 12030, an in-vehicle information detection unit 12040, and an integrated control unit 12050. Furthermore, a microcomputer 12051, a sound/image output unit 12052, and an on-board network interface (I/F) 12053 are illustrated as a functional configuration of the integrated control unit 12050.

The driving system control unit 12010 controls operations of devices relating to the driving system of the vehicle in accordance with various programs. For example, the driving system control unit 12010 functions as a control device for a driving force generation device for generating a driving force of the vehicle such as an internal combustion engine, a driving motor, or the like, a driving force transmission mechanism for transmitting a driving force to wheels, a steering mechanism for adjusting a steering angle of the vehicle, a braking device for generating a braking force of the vehicle, and the like.

The body system control unit 12020 controls operations of various devices mounted on a vehicle body in accordance with various programs. For example, the body system control unit 12020 functions as a control device for a keyless entry system, a smart key system, a power window device, or various lamps such as a headlamp, a backup lamp, a brake lamp, a turn signal, a fog lamp, or the like. In such a case, radio waves transmitted from a mobile device as an alternative to a key or signals from various switches can be input to the body system control unit 12020. The body system control unit 12020 receives these input radio waves or signals, and controls a door lock device, a power window device, a lamp, and the like of the vehicle.

The out-of-vehicle information detection unit 12030 detects information regarding the outside of the vehicle which includes the vehicle control system 12000 mounted thereon. For example, an imaging unit 12031 is connected to the out-of-vehicle information detection unit 12030. The out-of-vehicle information detection unit 12030 causes the imaging unit 12031 to image an image of the outside of the vehicle, and receives the imaged image. On the basis of the received image, the out-of-vehicle information detection unit 12030 may perform an object detection process or a distance detection process on a person, a vehicle, an obstacle, a sign, a character on a road surface, or the like.

The imaging unit 12031 is an optical sensor which receives light and outputs an electrical signal corresponding to the amount of received light. The imaging unit 12031 can output the electrical signal as an image, or as information regarding a measured distance. Furthermore, the light received by the imaging unit 12031 may be visible light, or may be invisible light such as infrared light.

The in-vehicle information detection unit 12040 detects information regarding the inside of the vehicle. For example, a driver state detection unit 12041 which detects the state of a driver is connected to the in-vehicle information detection unit 12040. The driver state detection unit 12041 includes, for example, a camera which images the driver, and on the basis of detection information input from the driver state detection unit 12041, the in-vehicle information detection unit 12040 may calculate the degree of fatigue or the degree of concentration of the driver, or may determine whether or not the driver is asleep.

The microcomputer 12051 can calculate a control target value of the driving force generation device, the steering mechanism, or the braking device on the basis of the information regarding the outside or inside of the vehicle acquired by the out-of-vehicle information detection unit 12030 or the in-vehicle information detection unit 12040, and can output a control command to the driving system control unit 12010. For example, the microcomputer 12051 can perform cooperative control for the purpose of realizing functions of an advanced driver assistance system (ADAS) including collision avoidance or shock mitigation for the vehicle, following driving based on a following distance, vehicle speed maintaining driving, a collision warning for the vehicle, a lane departure warning for the vehicle, and the like.

Furthermore, the microcomputer 12051 can perform cooperative control for the purpose of, for example, autonomous driving in which the vehicle autonomously travels without depending on an operation of a driver by controlling the driving force generation device, the steering mechanism, the braking device, or the like on the basis of the information regarding surroundings of the vehicle acquired by the out-of-vehicle information detection unit 12030 or the in-vehicle information detection unit 12040.

Furthermore, the microcomputer 12051 can output a control command to the body system control unit 12020 on the basis of the information regarding the outside of the vehicle acquired by the out-of-vehicle information detection unit 12030. For example, the microcomputer 12051 can perform cooperative control for the purpose of preventing glare by controlling the headlamps and switching a high beam to a low beam depending on a position of a preceding vehicle or an oncoming vehicle detected by the out-of-vehicle information detection unit 12030.

The sound/image output unit 12052 transmits an output signal of at least one of a sound or an image to an output device capable of visually or audibly notifying an occupant of the vehicle or outside the vehicle of information. In the example of FIG. 21, an audio speaker 12061, a display unit 12062, and an instrument panel 12063 are illustrated as the output devices. The display unit 12062 may include at least one of an on-board display or a head-up display, for example.

Figure 22:
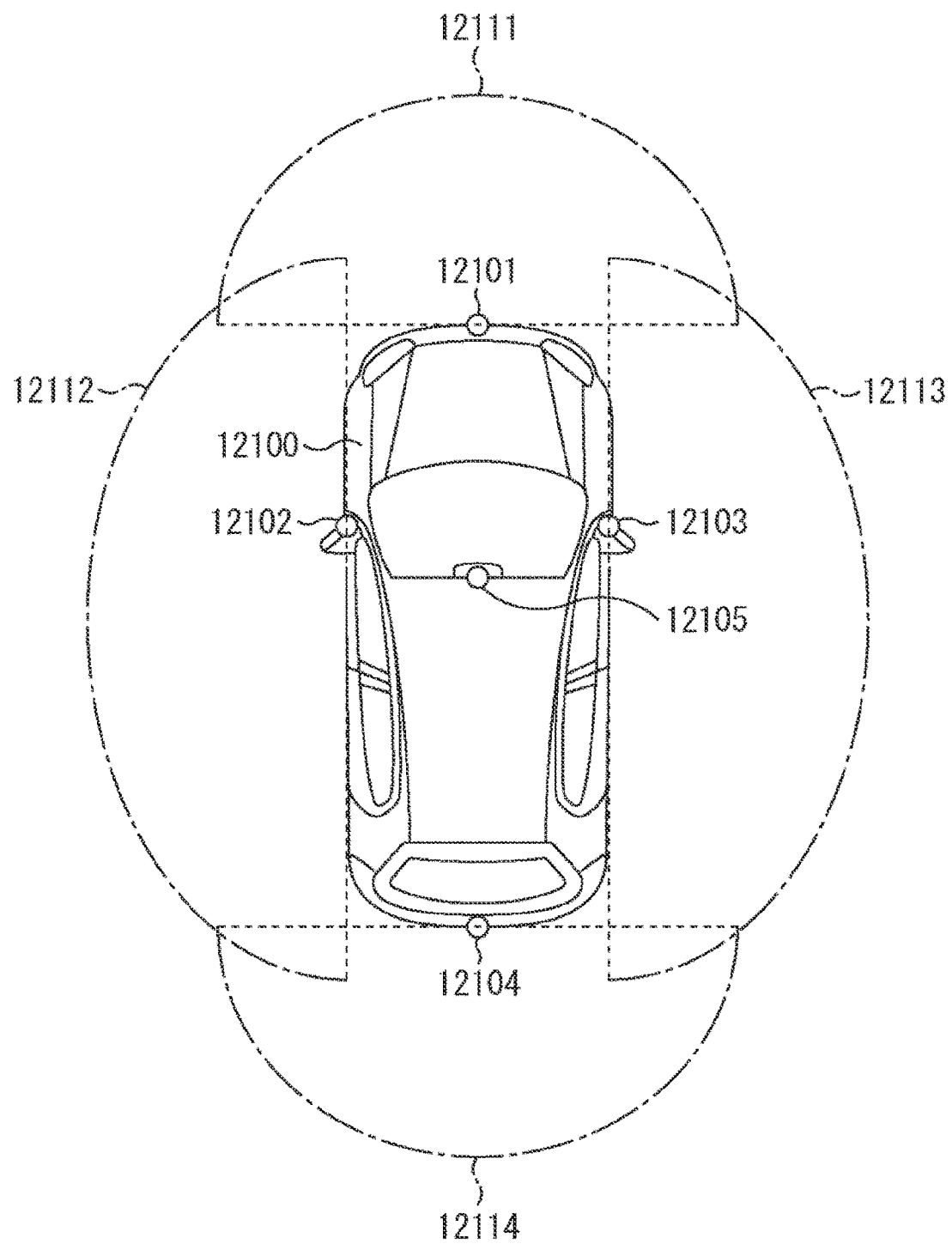
FIG. 22 is an explanatory view illustrating an example of an out-of-vehicle information detection unit and installation positions of imaging units.

FIG. 22 is a diagram illustrating an example of an installation position of the imaging unit 12031.

In FIG. 22, imaging units 12101, 12102, 12103, 12104, and 12105 are included as the imaging unit 12031.

The imaging units 12101, 12102, 12103, 12104, and 12105 are provided at positions, for example, a front nose, sideview mirrors, a rear bumper, and a back door of the vehicle 12100, as well as an upper portion of the windshield inside a cabin of the vehicle. The imaging unit 12101 provided on the front nose and the imaging unit 12105 provided on the upper portion of the windshield inside the cabin of the vehicle mainly acquire forward-view images of the vehicle 12100. The imaging units 12102 and 12103 provided on the sideview mirrors mainly acquire side-view images of the vehicle 12100. The imaging unit 12104 provided on the rear bumper or the back door mainly acquires rear-view images of the vehicle 12100. The imaging unit 12105 provided on the upper portion of the windshield inside the cabin of the vehicle is mainly used for detecting a preceding vehicle, a pedestrian, an obstacle, a traffic signal, a traffic sign, a lane, or the like.

Note that FIG. 22 illustrates an example of each of imaging ranges of the imaging units 12101 to 12104. An imaging range 12111 indicates an imaging range of the imaging unit 12101 provided on the front nose, imaging ranges 12112 and 12113 respectively indicate imaging ranges of the imaging units 12102 and 12103 provided on the sideview mirrors, and an imaging range 12114 indicates an imaging range of the imaging unit 12104 provided on the rear bumper or the back door. For example, by superimposing image data imaged by the imaging units 12101 to 12104, a bird's-eye view image of the vehicle 12100 viewed from above can be obtained.

At least one of the imaging units 12101 to 12104 may have a function of acquiring distance information. For example, at least one of the imaging units 12101 to 12104 may be a stereo camera including a plurality of imaging elements, or may be an imaging element including pixels for phase difference detection.

For example, by obtaining a distance to each three-dimensional object in the imaging ranges 12111 to 12114 and a temporal change in the distance (relative speed with respect to the vehicle 12100) on the basis of the distance information obtained from the imaging units 12101 to 12104, the microcomputer 12051 can extract, in particular, a nearest three-dimensional object which is present on a traveling path of the vehicle 12100 and travels at a predetermined speed (for example, equal to or more than 0 km/h) in substantially the same direction as the vehicle 12100, as a preceding vehicle. Moreover, the microcomputer 12051 can set a following distance to be maintained in advance in front of the preceding vehicle, and can perform automatic brake control (including following stop control), automatic acceleration control (including following start control), and the like. It is thus possible to perform cooperative control for the purpose of autonomous driving in which the vehicle autonomously travels without depending on the operation of the driver, or the like.

For example, it is possible for the microcomputer 12051 to classify three-dimensional object data about three-dimensional objects into data of a two-wheeled vehicle, a standard-sized vehicle, a large-sized vehicle, a pedestrian, and other three-dimensional objects such as a utility pole on the basis of the distance information obtained from the imaging units 12101 to 12104, to extract the classified data, and to use the extracted data for automatic avoidance of an obstacle. For example, the microcomputer 12051 distinguishes obstacles around the vehicle 12100 into obstacles visually recognizable by the driver of the vehicle 12100 and obstacles difficult for the driver to visually recognize. Then, the microcomputer 12051 determines a collision risk indicating a risk of collision with each obstacle, and if it is a situation where the collision risk is equal to or higher than a set value and there is a possibility of collision, the microcomputer 12051 outputs a warning to the driver via the audio speaker 12061 or the display unit 12062, or performs forced deceleration or avoidance steering via the driving system control unit 12010, and thereby the microcomputer 12051 can give assistance in driving for avoiding collision.

At least one of the imaging units 12101 to 12104 may be an infrared camera which detects infrared light. For example, the microcomputer 12051 can determine whether or not a pedestrian is present in images imaged by the imaging units 12101 to 12104 to thereby recognize the pedestrian. Such pedestrian recognition is performed by, for example, a procedure of extracting feature points in images imaged by the imaging units 12101 to 12104 as infrared cameras, and a procedure of performing a pattern matching process on a series of feature points indicating the contour of an object to determine whether or not the object is a pedestrian. If the microcomputer 12051 determines that a pedestrian is present in the images imaged by the imaging units 12101 to 12104 and recognizes the pedestrian, the sound/image output unit 12052 controls the display unit 12062 so as to superimpose a square contour line for emphasis on the recognized pedestrian to display the superimposed image. Furthermore, the sound/image output unit 12052 may control the display unit 12062 so as to display an icon or the like which indicates the pedestrian at a desired position.

Note that the effects described herein are merely examples and are not limited, and there may be another effect.

Note that the embodiment of the present technology is not limited to the embodiments described above. Various modifications may be made without departing from the gist of the present technology.

Note that the present technology may have the following configurations.

(1)

An imaging element including:

an organic photoelectric conversion film that has a light-transmitting property, is oriented in a predetermined axial direction, and includes a step;

an upper electrode arranged on a light incident surface side of the organic photoelectric conversion film; and a lower electrode arranged on a side of the organic photoelectric conversion film facing the upper electrode.

(2)

The imaging element according to the above-described (1), in which protrusions and recesses are formed on the light incident surface side of the organic photoelectric conversion film.

(3)

The imaging element according to the above-described (1) or (2), further including, between the organic photoelectric conversion film and the lower electrode, an accumulation layer that accumulates an electric charge converted by the organic photoelectric conversion film, in which the step is formed depending on the presence or absence of the accumulation layer.

(4)

The imaging element according to the above-described (1) or (2), further including, between the organic photoelectric conversion film and the lower electrode, an accumulation layer that accumulates an electric charge converted by the organic photoelectric conversion film, in which the step is formed depending on a difference in a thickness of the accumulation layer.

(5)

The imaging element according to the above-described (3) or (4), in which the accumulation layer includes a light-transmitting material.

(6)

The imaging element according to the above-described (3), in which a portion where the accumulation layer is formed further includes an insulating layer between the accumulation layer and the lower electrode.

(7)

The imaging element according to any one of the above-described (1) to (6), in which the lower electrode includes:

a first lower electrode that reads an electric charge generated in the organic photoelectric conversion film at an upper portion of the step, and a second lower electrode that reads an electric charge generated in the organic photoelectric conversion film at a lower portion of the step.

(8)

The imaging element according to the above-described (7), in which a wide dynamic range image is generated by composing an image based on an electric charge read from the first lower electrode and an image based on an electric charge read from the second lower electrode.

(9)

The imaging element according to the above-described (1) or (2), further including, between the organic photoelectric conversion film and the lower electrode, an accumulation layer that accumulates an electric charge converted by the organic photoelectric conversion film, in which the accumulation layer includes:

a first accumulation layer arrayed in a first direction; and a second accumulation layer arrayed in a second direction having a predetermined angle with the first direction.

(10)

The imaging element according to the above-described (9), in which the lower electrode includes:

a first lower electrode that reads an electric charge accumulated in the first accumulation layer; and a second lower electrode that reads an electric charge accumulated in the second accumulation layer.

(11)

The imaging element according to the above-described (10), in which a pixel value is corrected by performing a predetermined calculation using a pixel value based on an electric charge read from the first lower electrode and a pixel value based on an electric charge read from the second lower electrode.

(12)

An electronic apparatus including:

an imaging element that includes:

an organic photoelectric conversion film that has a light-transmitting property, is oriented in a predetermined axial direction, and includes a step;

an upper electrode arranged on a light incident surface side of the organic photoelectric conversion film; and a lower electrode arranged on a side of the organic photoelectric conversion film facing the upper electrode; and a processing unit that processes a signal from the imaging element.

(13)

An imaging element including:

an organic photoelectric conversion film that has a light-transmitting property, is oriented in a predetermined axial direction, and includes regions having different characteristics;

an upper electrode arranged on a light incident surface side of the organic photoelectric conversion film; and a lower electrode arranged on a side of the organic photoelectric conversion film facing the upper electrode.

(14)

The imaging element according to the above-described (13), in which the different characteristics include different sensitivities.

(15)

The imaging element according to the above-described (13) or (14), in which the organic photoelectric conversion film is formed on a surface in which hydrophilicity and hydrophobicity are alternately formed, and the organic photoelectric conversion film formed on the hydrophilicity and the organic photoelectric conversion film formed on the hydrophobicity have different characteristics from each other.

(16)

The imaging element according to any one of the above-described (13) to (15), in which the lower electrode includes:

a first lower electrode that reads an electric charge generated in the organic photoelectric conversion film having a first characteristic of the characteristics, and a second lower electrode that reads an electric charge generated in the organic photoelectric conversion film having a second characteristic of the characteristics.

(17)

An electronic apparatus including:

an imaging element that includes:

an organic photoelectric conversion film that has a light-transmitting property, is oriented in a predetermined axial direction, and includes regions having different characteristics;

an upper electrode arranged on a light incident surface side of the organic photoelectric conversion film; and a lower electrode arranged on a side of the organic photoelectric conversion film facing the upper electrode; and a processing unit that processes a signal from the imaging element.

REFERENCE SIGNS LIST

10 Imaging element
12 First light detection layer
16 Second light detection layer
22 Photoelectric conversion layer
30 On-chip lens
32 Planarization layer
34 Protective film
36 Upper electrode
38 Organic photoelectric conversion film
40 Interlayer insulating film
42 Light-shielding layer
44 Lower electrode
46 Insulating film
48 Orientation control layer
50 Organic dye
52 Conductive plug
54 Photoelectric conversion element
56 Silicon substrate
58 Multi-layered wiring layer
60 Support substrate
70 Image sensor
72 Pixel unit
74 Row scanning unit
76 Horizontal selection unit
78 Control unit
80 Column scanning unit
101 Transparent semiconductor layer
111 TG electrode
112 FD electrode
121 FD region
201 Image processing device
211 High-sensitivity image acquisition unit
212 Low-sensitivity image acquisition unit
213 Coefficient calculation unit
214 Composition unit
301 Pixel
401 Hydrophilicity control layer
411 Hydrophilic film
412 Hydrophobic film

The invention claimed is:
1. An imaging element, comprising:
an organic photoelectric conversion film that has a light-transmitting property, wherein
the organic photoelectric conversion film is configured to generate an electric charge based on an incident light,
an orientation of the organic photoelectric conversion film is in a specific axial direction,
the organic photoelectric conversion film includes a step, and
the step includes a protrusion and a recess;
an upper electrode on a light incident surface side of the organic photoelectric conversion film;
a lower electrode on a side of the organic photoelectric conversion film that faces the upper electrode; and
a first portion and a second portion, wherein
the first portion and the second portion are along a same plane and between the organic photoelectric conversion film and the lower electrode,
the first portion includes a transparent semiconductor layer having a first thickness,
the second portion is a portion that includes the transparent semiconductor layer having a second thickness,
the second thickness is lower than the first thickness,
the transparent semiconductor layer is configured to accumulate the generated electric charge,
the protrusion of the organic photoelectric conversion film is above the first portion, and
the recess of the organic photoelectric conversion film is above the second portion.

2. The imaging element according to claim 1, wherein the protrusion and the recess are on the light incident surface side of the organic photoelectric conversion film.

3. The imaging element according to claim 1, wherein the transparent semiconductor layer includes a light-transmitting material.

4. The imaging element according to claim 1, further comprising an insulating layer between the transparent semiconductor layer and the lower electrode.

5. The imaging element according to claim 1, wherein the lower electrode includes:
a first lower electrode configured to read the electric charge generated at the protrusion of the step, and
a second lower electrode configured to read the electric charge generated at the recess of the step.

6. The imaging element according to claim 5, wherein a wide dynamic range image is generated by composition of
an image based on the electric charge read from the first lower electrode, and
an image based on the electric charge read from the second lower electrode.

7. The imaging element according to claim 1,
the transparent semiconductor layer of the first portion is in a first direction; and
the transparent semiconductor layer of the second portion is in a second direction that has a specific angle with the first direction.

8. The imaging element according to claim 7, wherein the lower electrode includes:
a first lower electrode configured to read the accumulated electric charge in the transparent semiconductor layer of the first portion; and
a second lower electrode configured to read the accumulated electric charge in the transparent semiconductor layer of the second portion.

9. The imaging element according to claim 8, wherein
correction of a pixel value is based on a specific calculation, and
the specific calculation is using a first pixel value based on the electric charge read from the first lower electrode and a second pixel value based on the electric charge read from the second lower electrode.

10. An electronic apparatus, comprising:
an imaging element that includes:
an organic photoelectric conversion film that has a light-transmitting property, wherein
the organic photoelectric conversion film is configured to generate an electric charge based on an incident light,
an orientation of the organic photoelectric conversion film is in a specific axial direction,
the organic photoelectric conversion film includes a step, and
the step includes a protrusion and a recess;
an upper electrode on a light incident surface side of the organic photoelectric conversion film;

a lower electrode on a side of the organic photoelectric conversion film that faces the upper electrode; and
a first portion and a second portion, wherein
the first portion and the second portion are along a same plane and between the organic photoelectric conversion film and the lower electrode,
the first portion includes a transparent semiconductor layer having a first thickness,
the second portion is a portion that includes the transparent semiconductor layer having a second thickness,
the second thickness is lower than the first thickness,
the transparent semiconductor layer is configured to accumulate the generated electric charge,
the protrusion of the organic photoelectric conversion film is above the first portion, and
the recess of the organic photoelectric conversion film is above the second portion; and
a processing unit configured to process a signal from the imaging element.

11. An imaging element, comprising:
an organic photoelectric conversion film that has a light-transmitting property, wherein
the organic photoelectric conversion film is configured to generate an electric charge based on an incident light,
an orientation of the organic photoelectric conversion film is in a specific predetermined axial direction,
the organic photoelectric conversion film includes regions having different characteristics, and
the organic photoelectric conversion film includes a protrusion and a recess;
an upper electrode on a light incident surface side of the organic photoelectric conversion film;
a lower electrode on a side of the organic photoelectric conversion film that faces the upper electrode; and
a first portion and a second portion, wherein
the first portion and the second portion are along a same plane and between the organic photoelectric conversion film and the lower electrode,
the first portion includes a transparent semiconductor layer having a first thickness,
the second portion is a portion that includes the transparent semiconductor layer having a second thickness,
the second thickness is lower than the first thickness,
the transparent semiconductor layer is configured to accumulate the generated electric charge,
the protrusion of the organic photoelectric conversion film is above the first portion, and
the recess of the organic photoelectric conversion film is above the second portion.

12. The imaging element according to claim 11, wherein the different characteristics include pixel values of different sensitivities.

13. The imaging element according to claim 11, wherein the organic photoelectric conversion film is on a surface that includes an alternate arrangement of hydrophilicity and hydrophobicity, and
a characteristic of the organic photoelectric conversion film on the hydrophilicity is different from a characteristic of the organic photoelectric conversion film on the hydrophobicity.

14. The imaging element according to claim 11, wherein the lower electrode includes:
a first lower electrode configured to read the electric charge generated in the organic photoelectric conversion film having a first characteristic of the different characteristics, and
a second lower electrode configured to read the electric charge generated in the organic photoelectric conversion film having a second characteristic of the different characteristics.

15. An electronic apparatus, comprising:
an imaging element that includes:
an organic photoelectric conversion film that has a light-transmitting property, wherein
the organic photoelectric conversion film is configured to generate an electric charge based on an incident light,
an orientation of the organic photoelectric conversion film is in a specific axial direction,
the organic photoelectric conversion film includes regions having different characteristics, and
the organic photoelectric conversion film includes a protrusion and a recess;
an upper electrode on a light incident surface side of the organic photoelectric conversion film;
a lower electrode on a side of the organic photoelectric conversion film that faces the upper electrode; and
a first portion and a second portion, wherein
the first portion and the second portion are along a same plane and between the organic photoelectric conversion film and the lower electrode,
the first portion includes a transparent semiconductor layer having a first thickness,
the second portion is a portion that includes the transparent semiconductor layer having a second thickness,
the second thickness is lower than the first thickness,
the transparent semiconductor layer is configured to accumulate the generated electric charge,
the protrusion of the organic photoelectric conversion film is above the first portion, and
the recess of the organic photoelectric conversion film is above the second portion; and
a processing unit configured to process a signal from the imaging element.

* * * * *